US012199082B2

(12) United States Patent
Tao et al.

(10) Patent No.: US 12,199,082 B2
(45) Date of Patent: Jan. 14, 2025

(54) METHOD OF DIRECT-BONDED OPTOELECTRONIC DEVICES

(71) Applicant: ADEIA SEMICONDUCTOR TECHNOLOGIES LLC, San Jose, CA (US)

(72) Inventors: Min Tao, San Jose, CA (US); Liang Wang, Milpitas, CA (US); Rajesh Katkar, Milpitas, CA (US); Cyprian Emeka Uzoh, San Jose, CA (US)

(73) Assignee: ADEIA SEMICONDUCTOR TECHNOLOGIES LLC, San Jose, CA (US)

( * ) Notice: Subject to any disclaimer, the term of this patent is extended or adjusted under 35 U.S.C. 154(b) by 0 days.

(21) Appl. No.: 18/498,718

(22) Filed: Oct. 31, 2023

(65) Prior Publication Data
US 2024/0063199 A1    Feb. 22, 2024

Related U.S. Application Data

(63) Continuation of application No. 18/206,512, filed on Jun. 6, 2023, now Pat. No. 12,166,024, which is a
(Continued)

(51) Int. Cl.
*H01L 21/18* (2006.01)
*H01L 21/02* (2006.01)
(Continued)

(52) U.S. Cl.
CPC ...... *H01L 25/167* (2013.01); *H01L 21/02118* (2013.01); *H01L 21/3212* (2013.01);
(Continued)

(58) Field of Classification Search
CPC ......... H01L 21/187; H01L 2224/80894; H01L 2224/80895; H01L 2224/82894;
(Continued)

(56) References Cited

U.S. PATENT DOCUMENTS 4,998,665 A    3/1991    Hayashi
5,015,052 A    5/1991    Ridgway et al.
(Continued)

FOREIGN PATENT DOCUMENTS

CN    106206872 A    12/2016
EP    1 441 410 B1    4/2006
(Continued)

OTHER PUBLICATIONS

Amirfeiz et al., "Formation of silicon structures by plasma-activated wafer bonding," Journal of the Electrochemical Society, 2000, vol. 147, No. 7, pp. 2693-2698.
(Continued)

*Primary Examiner* — Hoai V Pham
(74) *Attorney, Agent, or Firm* — Knobbe, Martens, Olson & Bear, LLP

(57) ABSTRACT

Direct-bonded LED arrays and applications are provided. An example process fabricates a LED structure that includes coplanar electrical contacts for p-type and n-type semiconductors of the LED structure on a flat bonding interface surface of the LED structure. The coplanar electrical contacts of the flat bonding interface surface are direct-bonded to electrical contacts of a driver circuit for the LED structure. In a wafer-level process, micro-LED structures are fabricated on a first wafer, including coplanar electrical contacts for p-type and n-type semiconductors of the LED structures on the flat bonding interface surfaces of the wafer. At least the coplanar electrical contacts of the flat bonding interface are direct-bonded to electrical contacts of CMOS driver circuits on a second wafer. The process provides a transparent and flexible micro-LED array display, with each micro-LED structure having an illumination area approximately the size of a pixel or a smallest controllable element of an image represented on a high-resolution video display.

21 Claims, 11 Drawing Sheets

Related U.S. Application Data continuation of application No. 17/327,169, filed on May 21, 2021, now Pat. No. 11,715,730, which is a continuation of application No. 16/840,245, filed on Apr. 3, 2020, now Pat. No. 11,329,034, which is a continuation of application No. 15/919,570, filed on Mar. 13, 2018, now Pat. No. 10,629,577.

(60) Provisional application No. 62/472,363, filed on Mar. 16, 2017.

(51) Int. Cl.
| | | |
|---|---|---|
| *H01L 21/321* | (2006.01) | |
| *H01L 23/00* | (2006.01) | |
| *H01L 25/10* | (2006.01) | |
| *H01L 25/16* | (2023.01) | |
| *H01L 25/18* | (2023.01) | |
| *H01L 27/12* | (2006.01) | |
| *H01L 27/15* | (2006.01) | |
| *H01L 33/00* | (2010.01) | |
| *H01L 33/06* | (2010.01) | |
| *H01L 33/32* | (2010.01) | |
| *H01L 33/44* | (2010.01) | |
| *H01L 33/46* | (2010.01) | |
| *H01L 33/62* | (2010.01) | |

(52) U.S. Cl.
CPC .............. *H01L 24/08* (2013.01); *H01L 24/80* (2013.01); *H01L 25/105* (2013.01); *H01L 25/18* (2013.01); *H01L 27/1214* (2013.01); *H01L 27/156* (2013.01); *H01L 33/007* (2013.01); *H01L 33/0093* (2020.05); *H01L 33/06* (2013.01); *H01L 33/32* (2013.01); *H01L 33/44* (2013.01); *H01L 33/46* (2013.01); *H01L 33/62* (2013.01); *H01L 2224/08145* (2013.01); *H01L 2224/80013* (2013.01); *H01L 2224/80355* (2013.01); *H01L 2224/80357* (2013.01); *H01L 2933/0016* (2013.01); *H01L 2933/0025* (2013.01); *H01L 2933/0066* (2013.01)

(58) Field of Classification Search
CPC . H01L 2224/80896; H01L 2224/83894; H01L 2224/83895; H01L 2224/84894; H01L 2224/84897; H01L 2224/8583; H01L 2224/85895; H01L 2224/85897; H01L 2224/86895; H01L 2224/86896
USPC .................................................. 438/29, 69
See application file for complete search history.

(56) References Cited

U.S. PATENT DOCUMENTS

| | | |
|---|---|---|
| 5,087,585 A | 2/1992 | Hayashi |
| 5,225,797 A | 7/1993 | Schary et al. |
| 5,322,593 A | 6/1994 | Hasegawa et al. |
| 5,363,464 A | 11/1994 | Way et al. |
| 5,408,053 A | 4/1995 | Young |
| 5,471,090 A | 11/1995 | Deutsch et al. |
| 5,557,120 A * | 9/1996 | Martin ............... H01L 25/50 257/E21.705 |
| 5,753,536 A | 5/1998 | Sugiyama et al. |
| 5,771,555 A | 6/1998 | Eda et al. |
| 5,785,874 A | 7/1998 | Eda |
| 5,818,631 A | 10/1998 | Askinazi et al. |
| 5,985,739 A | 11/1999 | Plettner et al. |
| 5,998,808 A | 12/1999 | Matsushita |
| 6,008,126 A | 12/1999 | Leedy |
| 6,080,640 A | 6/2000 | Gardner et al. |
| 6,084,714 A | 7/2000 | Ushiyama et al. |
| 6,108,472 A | 8/2000 | Rickman et al. |
| 6,115,264 A | 9/2000 | Nosaka |
| 6,242,324 B1 | 6/2001 | Kub et al. |
| 6,265,775 B1 | 7/2001 | Seyyedy |
| 6,300,161 B1 | 10/2001 | Goetz et al. |
| 6,374,770 B1 | 4/2002 | Lee |
| 6,404,550 B1 | 6/2002 | Yajima |
| 6,418,029 B1 | 7/2002 | McKee et al. |
| 6,423,640 B1 | 7/2002 | Lee et al. |
| 6,429,532 B1 | 8/2002 | Han et al. |
| 6,442,321 B1 | 8/2002 | Berini |
| 6,465,892 B1 | 10/2002 | Suga |
| 6,614,960 B2 | 9/2003 | Berini |
| 6,638,808 B1 | 10/2003 | Ochi |
| 6,713,871 B2 | 3/2004 | Searls et al. |
| 6,759,692 B1 | 7/2004 | Ochi |
| 6,762,796 B1 | 7/2004 | Nakajoh et al. |
| 6,782,179 B2 | 8/2004 | Bozhevolnyi et al. |
| 6,801,691 B2 | 10/2004 | Berini |
| 6,868,258 B2 | 3/2005 | Hayata et al. |
| 6,887,769 B2 | 5/2005 | Kellar et al. |
| 6,908,027 B2 | 6/2005 | Tolchinsky et al. |
| 6,908,832 B2 | 6/2005 | Farrens et al. |
| 6,936,854 B2 | 8/2005 | Iwasaki et al. |
| 6,962,835 B2 | 11/2005 | Tong et al. |
| 7,010,183 B2 | 3/2006 | Estes et al. |
| 7,045,453 B2 | 5/2006 | Canaperi et al. |
| 7,060,634 B2 | 6/2006 | Rantala et al. |
| 7,078,811 B2 | 7/2006 | Suga |
| 7,105,980 B2 | 9/2006 | Abbott et al. |
| 7,126,212 B2 | 10/2006 | Enquist et al. |
| 7,144,827 B2 | 12/2006 | Rantala et al. |
| 7,193,423 B1 | 3/2007 | Dalton et al. |
| 7,339,798 B2 | 3/2008 | Chakravorty |
| 7,354,798 B2 | 4/2008 | Pogge et al. |
| 7,355,836 B2 | 4/2008 | Radhakrishnan et al. |
| 7,547,954 B2 | 6/2009 | Geusic et al. |
| 7,614,771 B2 | 11/2009 | McKechnie et al. |
| 7,626,216 B2 | 12/2009 | McKinzie, III |
| 7,705,691 B2 | 4/2010 | Lu et al. |
| 7,736,945 B2 | 6/2010 | Schiaffino et al. |
| 7,741,724 B2 | 6/2010 | Morikawa et al. |
| 7,746,663 B2 | 6/2010 | Hashimoto |
| 7,750,488 B2 | 7/2010 | Patti et al. |
| 7,791,429 B2 | 9/2010 | Chen et al. |
| 7,803,693 B2 | 9/2010 | Trezza |
| 8,009,763 B2 | 8/2011 | Risk et al. |
| 8,130,821 B2 | 3/2012 | Hopkins et al. |
| 8,153,505 B2 | 4/2012 | Tong et al. |
| 8,183,127 B2 | 5/2012 | Patti et al. |
| 8,211,722 B2 | 7/2012 | Lu |
| 8,241,961 B2 | 8/2012 | Kim et al. |
| 8,300,312 B2 | 10/2012 | Kobayashi et al. |
| 8,314,007 B2 | 11/2012 | Vaufredaz |
| 8,349,635 B1 | 1/2013 | Gan et al. |
| 8,357,931 B2 | 1/2013 | Schieck et al. |
| 8,377,798 B2 | 2/2013 | Peng et al. |
| 8,436,457 B2 | 5/2013 | Crisp et al. |
| 8,441,111 B2 | 5/2013 | Crisp et al. |
| 8,441,131 B2 | 5/2013 | Ryan |
| 8,476,146 B2 | 7/2013 | Chen et al. |
| 8,476,165 B2 | 7/2013 | Trickett et al. |
| 8,482,132 B2 | 7/2013 | Yang et al. |
| 8,483,253 B2 | 7/2013 | Budd et al. |
| 8,501,537 B2 | 8/2013 | Sadaka et al. |
| 8,524,533 B2 | 9/2013 | Tong et al. |
| 8,558,636 B2 | 10/2013 | Shin et al. |
| 8,620,164 B2 | 12/2013 | Heck et al. |
| 8,647,987 B2 | 2/2014 | Yang et al. |
| 8,657,448 B2 | 2/2014 | Kobayashi et al. |
| 8,697,493 B2 | 4/2014 | Sadaka |
| 8,698,323 B2 | 4/2014 | Mohammed et al. |
| 8,716,105 B2 | 5/2014 | Sadaka et al. |
| 8,764,197 B2 | 7/2014 | Kobayashi |
| 8,802,538 B1 | 8/2014 | Liu |
| 8,809,123 B2 | 8/2014 | Liu et al. |
| 8,841,002 B2 | 9/2014 | Tong |
| 8,865,489 B2 | 10/2014 | Rogers et al. |
| 8,916,448 B2 | 12/2014 | Cheng et al. |

(56) References Cited

U.S. PATENT DOCUMENTS

| | | |
|---|---|---|
| 8,929,077 B2 | 1/2015 | Gouramanis |
| 8,988,299 B2 | 3/2015 | Kam et al. |
| 9,022,571 B2 | 5/2015 | Kawase et al. |
| 9,093,350 B2 | 7/2015 | Endo et al. |
| 9,142,517 B2 | 9/2015 | Liu |
| 9,171,756 B2 | 10/2015 | Enquist et al. |
| 9,179,584 B2 | 11/2015 | La Porta et al. |
| 9,184,125 B2 | 11/2015 | Enquist et al. |
| 9,224,704 B2 | 12/2015 | Landru |
| 9,230,941 B2 | 1/2016 | Chen et al. |
| 9,257,399 B2 | 2/2016 | Kuang et al. |
| 9,263,186 B2 | 2/2016 | Li et al. |
| 9,299,736 B2 | 3/2016 | Chen et al. |
| 9,312,229 B2 | 4/2016 | Chen et al. |
| 9,331,149 B2 | 5/2016 | Tong et al. |
| 9,337,235 B2 | 5/2016 | Chen et al. |
| 9,368,866 B2 | 6/2016 | Yu |
| 9,385,024 B2 | 7/2016 | Tong et al. |
| 9,391,143 B2 | 7/2016 | Tong et al. |
| 9,394,161 B2 | 7/2016 | Cheng et al. |
| 9,431,368 B2 | 8/2016 | Enquist et al. |
| 9,434,145 B2 | 9/2016 | Erdogan et al. |
| 9,437,572 B2 | 9/2016 | Chen et al. |
| 9,443,796 B2 | 9/2016 | Chou et al. |
| 9,461,007 B2 | 10/2016 | Chun et al. |
| 9,496,202 B2 | 11/2016 | Hashimoto |
| 9,496,239 B1 | 11/2016 | Edelstein et al. |
| 9,536,848 B2 | 1/2017 | England et al. |
| 9,537,199 B2 | 1/2017 | Dang et al. |
| 9,551,880 B2 | 1/2017 | Amitai |
| 9,559,081 B1 | 1/2017 | Lai et al. |
| 9,618,834 B2 | 4/2017 | Miyabara et al. |
| 9,620,481 B2 | 4/2017 | Edelstein et al. |
| 9,625,713 B2 | 4/2017 | Helie et al. |
| 9,656,852 B2 | 5/2017 | Cheng et al. |
| 9,671,572 B2 | 6/2017 | Decker et al. |
| 9,711,694 B2 | 7/2017 | Robin et al. |
| 9,723,716 B2 | 8/2017 | Meinhold |
| 9,728,521 B2 | 8/2017 | Tsai et al. |
| 9,741,620 B2 | 8/2017 | Uzoh et al. |
| 9,744,754 B2 | 8/2017 | Wakamatsu et al. |
| 9,799,587 B2 | 10/2017 | Fujii et al. |
| 9,847,458 B2 | 12/2017 | Lee et al. |
| 9,852,988 B2 | 12/2017 | Enquist et al. |
| 9,881,882 B2 | 1/2018 | Hsu et al. |
| 9,893,004 B2 | 2/2018 | Yazdani |
| 9,899,442 B2 | 2/2018 | Katkar |
| 9,929,050 B2 | 3/2018 | Lin |
| 9,935,088 B2 | 4/2018 | Budd et al. |
| 9,941,241 B2 | 4/2018 | Edelstein et al. |
| 9,941,243 B2 | 4/2018 | Kim et al. |
| 9,953,941 B2 | 4/2018 | Enquist |
| 9,960,142 B2 | 5/2018 | Chen et al. |
| 9,960,152 B2 | 5/2018 | Bono et al. |
| 10,002,844 B1 | 6/2018 | Wang et al. |
| 10,026,605 B2 | 7/2018 | Doub et al. |
| 10,075,657 B2 | 9/2018 | Fahim et al. |
| 10,204,893 B2 | 2/2019 | Uzoh et al. |
| 10,269,756 B2 | 4/2019 | Uzoh |
| 10,276,619 B2 | 4/2019 | Kao et al. |
| 10,276,909 B2 | 4/2019 | Huang et al. |
| 10,418,277 B2 | 9/2019 | Cheng et al. |
| 10,446,487 B2 | 10/2019 | Huang et al. |
| 10,446,532 B2 | 10/2019 | Uzoh et al. |
| 10,475,778 B2 | 11/2019 | Pfeuffer et al. |
| 10,508,030 B2 | 12/2019 | Katkar et al. |
| 10,522,499 B2 | 12/2019 | Enquist et al. |
| 10,571,699 B1 | 2/2020 | Parsons et al. |
| 10,629,577 B2 | 4/2020 | Tao et al. |
| 10,707,087 B2 | 7/2020 | Uzoh et al. |
| 10,707,374 B2 | 7/2020 | Danesh et al. |
| 10,784,191 B2 | 9/2020 | Huang et al. |
| 10,790,262 B2 | 9/2020 | Uzoh et al. |
| 10,840,135 B2 | 11/2020 | Uzoh |
| 10,840,205 B2 | 11/2020 | Fountain, Jr. et al. |
| 10,854,578 B2 | 12/2020 | Morein |
| 10,879,212 B2 | 12/2020 | Uzoh et al. |
| 10,886,177 B2 | 1/2021 | DeLaCruz et al. |
| 10,892,246 B2 | 1/2021 | Uzoh |
| 10,923,408 B2 | 2/2021 | Huang et al. |
| 10,923,413 B2 | 2/2021 | DeLaCruz |
| 10,950,547 B2 | 3/2021 | Mohammed et al. |
| 10,964,664 B2 | 3/2021 | Mandalapu et al. |
| 10,985,133 B2 | 4/2021 | Uzoh |
| 10,991,804 B2 | 4/2021 | DeLaCruz et al. |
| 10,998,292 B2 | 5/2021 | Lee et al. |
| 11,004,757 B2 | 5/2021 | Katkar et al. |
| 11,011,494 B2 | 5/2021 | Gao et al. |
| 11,011,503 B2 | 5/2021 | Wang et al. |
| 11,031,285 B2 | 6/2021 | Katkar et al. |
| 11,056,348 B2 | 7/2021 | Theil |
| 11,088,099 B2 | 8/2021 | Katkar et al. |
| 11,127,738 B2 | 9/2021 | DeLaCruz et al. |
| 11,158,606 B2 | 10/2021 | Gao et al. |
| 11,171,117 B2 | 11/2021 | Gao et al. |
| 11,176,450 B2 | 11/2021 | Teig et al. |
| 11,256,004 B2 | 2/2022 | Haba et al. |
| 11,264,357 B1 | 3/2022 | DeLaCruz et al. |
| 11,276,676 B2 | 3/2022 | Enquist et al. |
| 11,296,044 B2 | 4/2022 | Gao et al. |
| 11,329,034 B2 | 5/2022 | Tao et al. |
| 11,348,898 B2 | 5/2022 | DeLaCruz et al. |
| 11,355,443 B2 | 6/2022 | Huang et al. |
| 11,624,882 B2 | 4/2023 | Pezeshki et al. |
| 11,715,730 B2 | 8/2023 | Tao et al. |
| 11,762,200 B2 | 9/2023 | Katkar et al. |
| 11,860,415 B2 | 1/2024 | Huang et al. |
| 2002/0000328 A1 | 1/2002 | Motomura et al. |
| 2002/0003307 A1 | 1/2002 | Suga |
| 2002/0025101 A1 | 2/2002 | Kaatz |
| 2002/0131715 A1 | 9/2002 | Brady |
| 2003/0081906 A1 | 5/2003 | Filhaber et al. |
| 2003/0168716 A1 | 9/2003 | Lee et al. |
| 2004/0071424 A1 | 4/2004 | Hiraka et al. |
| 2004/0084414 A1 | 5/2004 | Sakai et al. |
| 2004/0149991 A1 | 8/2004 | Won |
| 2004/0155692 A1 | 8/2004 | Ochi |
| 2004/0157407 A1 | 8/2004 | Tong et al. |
| 2004/0207043 A1 | 10/2004 | Matsunaga et al. |
| 2004/0226910 A1 | 11/2004 | Chatterjee et al. |
| 2005/0063134 A1 | 3/2005 | Kim et al. |
| 2005/0063437 A1 | 3/2005 | Horng et al. |
| 2005/0135041 A1 | 6/2005 | Kang et al. |
| 2005/0190808 A1 | 9/2005 | Yonekura et al. |
| 2005/0226299 A1 | 10/2005 | Horng et al. |
| 2005/0231303 A1 | 10/2005 | Chang et al. |
| 2006/0012966 A1 | 1/2006 | Chakravorty |
| 2006/0017144 A1 | 1/2006 | Uematsu et al. |
| 2006/0057945 A1 | 3/2006 | Hsu et al. |
| 2006/0145778 A1 | 7/2006 | Pleva et al. |
| 2007/0045814 A1 | 3/2007 | Yamamoto et al. |
| 2007/0085165 A1 | 4/2007 | Oh et al. |
| 2007/0096130 A1 | 5/2007 | Schiaffino et al. |
| 2007/0096294 A1 | 5/2007 | Ikeda et al. |
| 2007/0111386 A1 | 5/2007 | Kim et al. |
| 2007/0147014 A1 | 6/2007 | Chang et al. |
| 2007/0222048 A1 | 9/2007 | Huang |
| 2007/0295456 A1 | 12/2007 | Gudeman et al. |
| 2008/0124835 A1 | 5/2008 | Chen et al. |
| 2008/0150821 A1 | 6/2008 | Koch et al. |
| 2009/0009103 A1 | 1/2009 | McKechnie et al. |
| 2009/0052827 A1 | 2/2009 | Durfee et al. |
| 2009/0165854 A1 | 7/2009 | Yamazaki et al. |
| 2009/0206962 A1 | 8/2009 | Chou et al. |
| 2009/0242252 A1 | 10/2009 | Tanaka |
| 2010/0317132 A1 | 12/2010 | Rogers et al. |
| 2011/0018657 A1 | 1/2011 | Cheng et al. |
| 2011/0024918 A1 | 2/2011 | Brunnbauer et al. |
| 2011/0059275 A1 | 3/2011 | Stark |
| 2011/0113828 A1 | 5/2011 | Matsumoto |
| 2011/0115579 A1 | 5/2011 | Rofougaran |
| 2011/0165707 A1 | 7/2011 | Lott et al. |
| 2011/0290552 A1 | 12/2011 | Palmateer et al. |
| 2011/0294242 A1 | 12/2011 | Lu |

(56) References Cited

U.S. PATENT DOCUMENTS

| | | |
|---|---|---|
| 2012/0013013 A1 | 1/2012 | Sadaka et al. |
| 2012/0013499 A1 | 1/2012 | Hayata |
| 2012/0100318 A1 | 4/2012 | Danzl et al. |
| 2012/0147516 A1 | 6/2012 | Kim et al. |
| 2012/0168217 A1 | 7/2012 | Hsu et al. |
| 2012/0189317 A1 | 7/2012 | Heck et al. |
| 2012/0212384 A1 | 8/2012 | Kam et al. |
| 2013/0009183 A1 | 1/2013 | Han |
| 2013/0009325 A1 | 1/2013 | Mori et al. |
| 2013/0020666 A1 | 1/2013 | Smith |
| 2013/0063863 A1 | 3/2013 | Timler et al. |
| 2013/0072011 A1 | 3/2013 | Zhang et al. |
| 2013/0083583 A1 | 4/2013 | Crisp et al. |
| 2013/0105943 A1 | 5/2013 | Lai et al. |
| 2013/0122617 A1 | 5/2013 | Lott et al. |
| 2013/0170145 A1 | 7/2013 | Gouramanis |
| 2013/0207234 A1 | 8/2013 | Ikeda et al. |
| 2013/0250430 A1 | 9/2013 | Robbins et al. |
| 2013/0265733 A1 | 10/2013 | Herbsommer et al. |
| 2013/0286544 A1 | 10/2013 | Azais |
| 2014/0001568 A1 | 1/2014 | Wang et al. |
| 2014/0048908 A1 | 2/2014 | Chen et al. |
| 2014/0071519 A1 | 3/2014 | Chen et al. |
| 2014/0116761 A1 | 5/2014 | Lee et al. |
| 2014/0145338 A1 | 5/2014 | Fujii et al. |
| 2014/0175629 A1 | 6/2014 | Sun et al. |
| 2014/0175655 A1 | 6/2014 | Chen et al. |
| 2014/0177189 A1 | 6/2014 | Liu et al. |
| 2014/0184351 A1 | 7/2014 | Bae et al. |
| 2014/0225795 A1 | 8/2014 | Yu |
| 2014/0252635 A1 | 9/2014 | Tran et al. |
| 2014/0264751 A1 | 9/2014 | Chen et al. |
| 2014/0264948 A1 | 9/2014 | Chou et al. |
| 2014/0294342 A1 | 10/2014 | Offriein et al. |
| 2014/0370658 A1 | 12/2014 | Tong et al. |
| 2014/0377946 A1 | 12/2014 | Cha et al. |
| 2015/0021626 A1 | 1/2015 | Nakamura et al. |
| 2015/0064498 A1 | 3/2015 | Tong |
| 2015/0097298 A1 | 4/2015 | Chen et al. |
| 2015/0179539 A1 | 6/2015 | Tamai |
| 2015/0194379 A1 | 7/2015 | Chen et al. |
| 2015/0206902 A1 | 7/2015 | Cheng et al. |
| 2015/0221571 A1 | 8/2015 | Chaparala et al. |
| 2015/0235952 A1 | 8/2015 | Pan et al. |
| 2015/0270209 A1 | 9/2015 | Woychik et al. |
| 2015/0318618 A1 | 11/2015 | Chen et al. |
| 2015/0328875 A1 | 11/2015 | Hattori et al. |
| 2016/0027765 A1 | 1/2016 | von Malm et al. |
| 2016/0070078 A1 | 3/2016 | Budd et al. |
| 2016/0077294 A1 | 3/2016 | Jou et al. |
| 2016/0111404 A1 | 4/2016 | Sanders et al. |
| 2016/0116673 A1 | 4/2016 | Budd et al. |
| 2016/0141469 A1 | 5/2016 | Robin et al. |
| 2016/0155677 A1 | 6/2016 | Bonart et al. |
| 2016/0181477 A1 | 6/2016 | Lee et al. |
| 2016/0197630 A1 | 7/2016 | Kawasaki |
| 2016/0233195 A1 | 8/2016 | Nagai |
| 2016/0254345 A1 | 9/2016 | Singh et al. |
| 2016/0291265 A1 | 10/2016 | Kinghorn et al. |
| 2016/0309578 A1 | 10/2016 | Park |
| 2016/0343682 A1 | 11/2016 | Kawasaki |
| 2016/0372449 A1 | 12/2016 | Rusu et al. |
| 2017/0019086 A1 | 1/2017 | Dueweke |
| 2017/0047312 A1 | 2/2017 | Budd et al. |
| 2017/0062409 A1 | 3/2017 | Basker et al. |
| 2017/0069609 A1 | 3/2017 | Zhang et al. |
| 2017/0148777 A1 | 5/2017 | Bono et al. |
| 2017/0179029 A1 | 6/2017 | Enquist et al. |
| 2017/0186670 A1 | 6/2017 | Budd et al. |
| 2017/0186730 A1 | 6/2017 | Shen et al. |
| 2017/0194271 A1 | 7/2017 | Hsu et al. |
| 2017/0207600 A1 | 7/2017 | Klamkin et al. |
| 2017/0213502 A1 | 7/2017 | Henry et al. |
| 2017/0315299 A1 | 11/2017 | Mathai et al. |
| 2017/0330858 A1 | 11/2017 | Lee et al. |
| 2017/0331050 A1 | 11/2017 | Yagi et al. |
| 2017/0338214 A1 | 11/2017 | Uzoh et al. |
| 2017/0343498 A1 | 11/2017 | Kalnitsky et al. |
| 2018/0074322 A1 | 3/2018 | Rousseau et al. |
| 2018/0120568 A1 | 5/2018 | Miller et al. |
| 2018/0156965 A1 | 6/2018 | El-Ghoroury et al. |
| 2018/0175012 A1 | 6/2018 | Wu et al. |
| 2018/0182639 A1 | 6/2018 | Uzoh et al. |
| 2018/0182666 A1 | 6/2018 | Uzoh et al. |
| 2018/0190580 A1 | 7/2018 | Haba et al. |
| 2018/0190583 A1 | 7/2018 | DeLaCruz et al. |
| 2018/0191047 A1 | 7/2018 | Huang et al. |
| 2018/0219038 A1 | 8/2018 | Gambino et al. |
| 2018/0261645 A1 | 9/2018 | Na et al. |
| 2018/0277523 A1 | 9/2018 | Ahmed et al. |
| 2018/0286805 A1 | 10/2018 | Huang et al. |
| 2018/0323177 A1 | 11/2018 | Yu et al. |
| 2018/0323227 A1 | 11/2018 | Zhang et al. |
| 2018/0331000 A1 | 11/2018 | DeLaCruz et al. |
| 2018/0331066 A1 | 11/2018 | Uzoh et al. |
| 2018/0358332 A1 | 12/2018 | Kim |
| 2019/0018245 A1 | 1/2019 | Cheng et al. |
| 2019/0088633 A1 | 3/2019 | Tao et al. |
| 2019/0096741 A1 | 3/2019 | Uzoh et al. |
| 2019/0115277 A1 | 4/2019 | Yu et al. |
| 2019/0131277 A1 | 5/2019 | Yang et al. |
| 2019/0198409 A1 | 6/2019 | Katkar et al. |
| 2019/0227320 A1 | 7/2019 | Bonar et al. |
| 2019/0265411 A1 | 8/2019 | Huang et al. |
| 2019/0287949 A1 | 9/2019 | Chong et al. |
| 2019/0309936 A1 | 10/2019 | Kondo et al. |
| 2019/0333550 A1 | 10/2019 | Fisch |
| 2019/0385935 A1 | 12/2019 | Gao et al. |
| 2019/0385966 A1 | 12/2019 | Gao et al. |
| 2020/0013637 A1 | 1/2020 | Haba |
| 2020/0013765 A1 | 1/2020 | Fountain, Jr. et al. |
| 2020/0035641 A1 | 1/2020 | Fountain, Jr. et al. |
| 2020/0043817 A1 | 2/2020 | Shen et al. |
| 2020/0075553 A1 | 3/2020 | DeLaCruz et al. |
| 2020/0118973 A1 | 4/2020 | Wang et al. |
| 2020/0126906 A1 | 4/2020 | Uzoh et al. |
| 2020/0194396 A1 | 6/2020 | Uzoh |
| 2020/0194614 A1 | 6/2020 | Pares |
| 2020/0194635 A1 | 6/2020 | Yuasa et al. |
| 2020/0218009 A1 | 7/2020 | Preston et al. |
| 2020/0227367 A1 | 7/2020 | Haba et al. |
| 2020/0235085 A1 | 7/2020 | Tao et al. |
| 2020/0243380 A1 | 7/2020 | Uzoh et al. |
| 2020/0279821 A1 | 9/2020 | Haba et al. |
| 2020/0294908 A1 | 9/2020 | Haba et al. |
| 2020/0321307 A1 | 10/2020 | Uzoh |
| 2020/0328162 A1 | 10/2020 | Haba et al. |
| 2020/0328164 A1 | 10/2020 | DeLaCruz et al. |
| 2020/0328165 A1 | 10/2020 | DeLaCruz et al. |
| 2020/0335408 A1 | 10/2020 | Gao et al. |
| 2020/0365575 A1 | 11/2020 | Uzoh et al. |
| 2020/0371154 A1 | 11/2020 | DeLaCruz et al. |
| 2020/0395321 A1 | 12/2020 | Katkar et al. |
| 2020/0411483 A1 | 12/2020 | Uzoh et al. |
| 2020/0411587 A1 | 12/2020 | Pezeshki et al. |
| 2021/0098412 A1 | 4/2021 | Haba et al. |
| 2021/0118853 A1 | 4/2021 | Harris et al. |
| 2021/0118864 A1 | 4/2021 | DeLaCruz et al. |
| 2021/0143125 A1 | 5/2021 | DeLaCruz et al. |
| 2021/0151408 A1 | 5/2021 | Yu et al. |
| 2021/0181510 A1 | 6/2021 | Katkar et al. |
| 2021/0193603 A1 | 6/2021 | Katkar et al. |
| 2021/0193624 A1 | 6/2021 | DeLaCruz et al. |
| 2021/0193625 A1 | 6/2021 | DeLaCruz et al. |
| 2021/0242152 A1 | 8/2021 | Fountain, Jr. et al. |
| 2021/0265331 A1 | 8/2021 | Wang et al. |
| 2021/0288037 A1 | 9/2021 | Tao et al. |
| 2021/0296282 A1 | 9/2021 | Gao et al. |
| 2021/0305202 A1 | 9/2021 | Uzoh et al. |
| 2021/0366820 A1 | 11/2021 | Uzoh |
| 2021/0407941 A1 | 12/2021 | Haba |
| 2022/0043209 A1 | 2/2022 | Huang et al. |
| 2022/0077063 A1 | 3/2022 | Haba |
| 2022/0077087 A1 | 3/2022 | Haba |

(56) References Cited

U.S. PATENT DOCUMENTS

| | | |
|---|---|---|
| 2022/0139867 A1 | 5/2022 | Uzoh |
| 2022/0139869 A1 | 5/2022 | Gao et al. |
| 2022/0155490 A1 | 5/2022 | Haba et al. |
| 2022/0208650 A1 | 6/2022 | Gao et al. |
| 2022/0208702 A1 | 6/2022 | Uzoh |
| 2022/0208723 A1 | 6/2022 | Katkar et al. |
| 2022/0246497 A1 | 8/2022 | Fountain, Jr. et al. |
| 2022/0285303 A1 | 9/2022 | Mirkarimi et al. |
| 2022/0319901 A1 | 10/2022 | Suwito et al. |
| 2022/0320035 A1 | 10/2022 | Uzoh et al. |
| 2022/0320036 A1 | 10/2022 | Gao et al. |
| 2023/0005850 A1 | 1/2023 | Fountain, Jr. |
| 2023/0019869 A1 | 1/2023 | Mirkarimi et al. |
| 2023/0036441 A1 | 2/2023 | Haba et al. |
| 2023/0067677 A1 | 3/2023 | Lee et al. |
| 2023/0069183 A1 | 3/2023 | Haba |
| 2023/0100032 A1 | 3/2023 | Haba et al. |
| 2023/0115122 A1 | 4/2023 | Uzoh et al. |
| 2023/0122531 A1 | 4/2023 | Uzoh |
| 2023/0123423 A1 | 4/2023 | Gao et al. |
| 2023/0125395 A1 | 4/2023 | Gao et al. |
| 2023/0130259 A1 | 4/2023 | Haba et al. |
| 2023/0132632 A1 | 5/2023 | Katkar et al. |
| 2023/0140107 A1 | 5/2023 | Uzoh et al. |
| 2023/0142680 A1 | 5/2023 | Guevara et al. |
| 2023/0154816 A1 | 5/2023 | Haba et al. |
| 2023/0154828 A1 | 5/2023 | Haba et al. |
| 2023/0161120 A1 | 5/2023 | Yu et al. |
| 2023/0187264 A1 | 6/2023 | Uzoh et al. |
| 2023/0187317 A1 | 6/2023 | Uzoh |
| 2023/0187412 A1 | 6/2023 | Gao et al. |
| 2023/0197453 A1 | 6/2023 | Fountain, Jr. et al. |
| 2023/0197496 A1 | 6/2023 | Theil |
| 2023/0197559 A1 | 6/2023 | Haba et al. |
| 2023/0197560 A1 | 6/2023 | Katkar et al. |
| 2023/0197655 A1 | 6/2023 | Theil et al. |
| 2023/0207402 A1 | 6/2023 | Fountain, Jr. et al. |
| 2023/0207437 A1 | 6/2023 | Haba |
| 2023/0207474 A1 | 6/2023 | Uzoh et al. |
| 2023/0207514 A1 | 6/2023 | Gao et al. |
| 2023/0215836 A1 | 7/2023 | Haba et al. |
| 2023/0245950 A1 | 8/2023 | Haba et al. |
| 2023/0268300 A1 | 8/2023 | Uzoh et al. |
| 2023/0299029 A1 | 9/2023 | Theil et al. |
| 2023/0317703 A1 | 10/2023 | Tao et al. |
| 2023/0343734 A1 | 10/2023 | Uzoh et al. |
| 2024/0103274 A1 | 3/2024 | Katkar et al. |
| 2024/0118492 A1 | 4/2024 | Huang et al. |

FOREIGN PATENT DOCUMENTS

| | | |
|---|---|---|
| JP | 60-257413 A | 12/1985 |
| JP | 10-189671 A | 7/1998 |
| JP | 2000-100679 | 4/2000 |
| JP | 2001-102479 | 4/2001 |
| JP | 2002-353416 | 12/2002 |
| JP | 2003-043281 | 2/2003 |
| JP | 2005086044 A | 3/2005 |
| JP | 2005123522 A | 5/2005 |
| JP | 2006-276313 A | 10/2006 |
| JP | 2007-041117 | 2/2007 |
| JP | 2008-258258 | 10/2008 |
| JP | 2010-276940 | 12/2010 |
| JP | 2013-33786 | 2/2013 |
| JP | 2017-177519 | 10/2017 |
| JP | 2018-160519 | 10/2018 |
| JP | 2019192888 A | 10/2019 |
| KR | 10-2006-0105797 | 10/2006 |
| KR | 10-2015-0097798 | 8/2015 |
| WO | WO 02/075387 A2 | 9/2002 |
| WO | WO 2005/043584 A2 | 5/2005 |
| WO | WO 2005/064646 A2 | 7/2005 |
| WO | WO 2006/100444 A1 | 9/2006 |
| WO | WO 2012/125237 A2 | 9/2012 |
| WO | WO 2016/057259 A1 | 4/2016 |
| WO | WO 2017/089676 A1 | 6/2017 |
| WO | WO 2017/151442 A1 | 9/2017 |
| WO | WO 2018/223150 A1 | 12/2018 |
| WO | WO 2019/143413 A1 | 7/2019 |

OTHER PUBLICATIONS

Bajwa, Rayan et al., "Integrated on-chip transformers: Recent progress in the design, layout, modeling and fabrication," Sensors, 2019, vol. 19, pp. 3535-3559.

Chung et al., "Room temperature GaAseu + Si and InPeu + Si wafer direct bonding by the surface activate bonding method," Nuclear Instruments and Methods in Physics Research Section B: Beam Interactions with Materials and Atoms, Jan. 2, 1997, vol. 121, Issues 1-4, pp. 203-206.

Chung et al., "Wafer direct bonding of compound semiconductors and silicon at room temperature by the surface activated bonding method," Applied Surface Science, Jun. 2, 1997, vols. 117-118, pp. 808-812.

Farrens et al., "Chemical free room temperature wafer to wafer direct bonding," J. Electrochem. Soc., The Electrochemical Society, Inc., Nov. 1995, vol. 142, No. 11. pp. 3949-3955.

Farrens et al., "Chemical free wafer bonding of silicon to glass and sapphire," Electrochemical Society Proceedings vol. 95-7, 1995, pp. 72-77.

Gösele et al., "Semiconductor Wafer Bonding: A flexible approach to materials combinations in microelectronics; micromechanics and optoelectronics," IEEE, 1997, pp. 23-32.

Hosoda et al., "Effect of the surface treatment on the room-temperature bonding of Al to Si and SiO2," Journal of Materials Science, Jan. 1, 1998, vol. 33, Issue 1, pp. 253-258.

Hosoda et al., "Room temperature GaAs—Si and InP—Si wafer direct bonding by the surface activated bonding method," Nuclear Inst. and Methods in Physics Research B, 1997, vol. 121, Nos. 1-4, pp. 203-206.

Howlader et al., "A novel method for bonding of ionic wafers," Electronics Components and Technology Conference, 2006, IEEE, pp. 7-pp.

Howlader et al., "Bonding of p-Si/n-InP wafers through surface activated bonding method at room temperature," Indium Phosphide and Related Materials, 2001, IEEE International Conference on, pp. 272-275.

Howlader et al., "Characterization of the bonding strength and interface current of p-Si/ n-InP wafers bonded by surface activated bonding method at room temperature," Journal of Applied Physics, Mar. 1, 2002, vol. 91, No. 5, pp. 3062-3066.

Howlader et al., "Investigation of the bonding strength and interface current of p-SionGaAs wafers bonded by surface activated bonding at room temperature," J. Vac. Sci. Technol. B 19, Nov./Dec. 2001, pp. 2114-2118.

International Search Report and Written Opinion, dated Jun. 29, 2018 in PCT Application No. PCT/US2018/022199, 17 pages.

Itoh et al., "Characteristics of fritting contacts utilized for micromachined wafer probe cards," 2000 American Institute of Physics, AIP Review of Scientific Instruments, vol. 71, 2000, pp. 2224.

Itoh et al., "Characteristics of low force contact process for MEMS probe cards," Sensors and Actuators A: Physical, Apr. 1, 2002, vols. 97-98, pp. 462-467.

Itoh et al., "Development of MEMS IC probe card utilizing fritting contact," Initiatives of Precision Engineering at the Beginning of a Millennium: 10th International Conference on Precision Engineering (ICPE) Jul. 18-20, 2001, Yokohama, Japan, 2002, Book Part 1, pp. 314-318.

Itoh et al., "Room temperature vacuum sealing using surface activated bonding method," The 12th International Conference on Solid State Sensors, Actuators and Microsystems, Boston, Jun. 8-12, 2003, 2003 IEEE, pp. 1828-1831.

Jeon, Y. et al., "Design of an on-interposer passive equalizer for high bandwidth memory (HBM) with 30Gbps data transmission," Electronic Components and Technology Conference (ECTC), 2016 IEEE 66th, Aug. 18, 2016.

(56) References Cited

OTHER PUBLICATIONS

Ker, Ming-Dou et al., "Fully process-compatible layout design on bond pad to improve wire bond reliability in CMOS ICs," IEEE Transactions on Components and Packaging Technologies, Jun. 2002, vol. 25, No. 2, pp. 309-316.
Kim et al., "Low temperature direct Cu—Cu bonding with low energy ion activation method," Electronic Materials and Packaging, 2001, IEEE, pp. 193-195.
Kim et al., "Room temperature Cu—Cu direct bonding using surface activated bonding method," J. Vac. Sci. Technol., 2003 American Vacuum Society, Mar./Apr. 2003, vol. 21, No. 2, pp. 449-453.
Kim et al., "Wafer-scale activated bonding of Cu—CU, Cu—Si, and Cu—SiO2 at low temperature," Proceedings—Electrochemical Society, 2003, vol. 19, pp. 239-247.
Kim, H. et al., "A wideband on-interposer passive equalizer design for chip-to-chip 30-GB/s serial data transmission," IEEE Transactions on Components, Packaging and Manufacturing Technology, Jan. 2015, vol. 5, Issue 1, pp. 28-39.
Lee, H. et al., "Signal integrity of bump-less high-speed through silicon via channel for terabyte/s bandwidth 2.5D IC," 2016 IEEE 66th Electronic Components and Technology Conference, Aug. 18, 2016.
Matsuzawa et al., "Room-temperature interconnection of electroplated Au microbump by means of surface activated bonding method," Electronic Components and Technology Conference, 2001, 51st Proceedings, IEEE, pp. 384-387.
Moriceau, H. et al., "Overview of recent direct wafer bonding advances and applications," Advances in Natural Sciences—Nanoscience and Nanotechnology, 2010, 11 pages.
Nakanishi, H. et al., "Studies on SiO2—SiO2 bonding with hydrofluoric acid. Room temperature and low stress bonding technique for MEMS," Sensors and Actuators, 2000, vol. 79, pp. 237-244.
Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1 (l), 6 pages.
Onodera et al., "The effect of prebonding heat treatment on the separability of Au wire from Ag-plated Cu alloy substrate," Electronics Packaging Manufacturing, IEEE Transactions, Jan. 2002, vol. 25, Issue 1, pp. 5-12.
Plobi, A. et al., "Wafer direct bonding: tailoring adhesion between brittle materials," Materials Science and Engineering Review Journal, 1999, R25, 88 pages.
Reiche et al., "The effect of a plasma pretreatment on the Si/Si bonding behaviour," Electrochemical Society Proceedings, 1998, vol. 97-36, pp. 437-444.
Roberds et al., "Low temperature , in situ, plasma activated wafer bonding," Electrochemical Society Proceedings, 1997, vol. 97-36, pp. 598-606.
Shigetou et al., "Room temperature bonding of ultra-fine pitch and low-profiled Cu electrodes for bump-less interconnect," 2003 Electronic Components and Technology Conference, pp. 848-852.
Shigetou et al., "Room-temperature direct bonding of CMP-Cu film for bumpless interconnection," Electronic Components and Technology Conference, 51st Proceedings, 2001, IEEE, pp. 755-760.
Shingo et al., "Design and fabrication of an electrostatically actuated MEMS probe card," Transducers, Solid-State Sensors, Actuators and Microsystems, 12th International Conference, Jun. 8-12, 2003, vol. 2, pp. 1522-1525.
Suga et al., "A new approach to Cu—Cu direct bump bonding," IEMT/IMC Symposium, 1997, Joint International Electronic Manufacturing Symposium and the International Microelectronics Conference, Apr. 16-18, 1997, IEEE, pp. 146-151.
Suga et al., "A new bumping process using lead-free solder paste," Electronics Packaging Manufacturing, IEEE Transactions on (vol. 25, Issue 4), IEEE, Oct. 2002, pp. 253-256.
Suga et al., "A new wafer-bonder of ultra-high precision using surface activated bonding (SAB) concept," Electronic Components and Technology Conference, 2001, IEEE, pp. 1013-1018.
Suga et al., "Bump-less interconnect for next generation system packaging," Electronic Components and Technology Conference, 2001, IEEE, pp. 1003-1008.
Suga, T., "Feasibility of surface activated bonding for ultra-fine pitch interconnection—A new concept of bump-less direct bonding for system level packaging," The University of Tokyo, Research Center for Science and Technology, 2000 Electronic Components and Technology Conference, 2000 IEEE, pp. 702-705.
Suga, T., "Room-temperature bonding on metals and ceramics," Proceedings of the Second International Symposium on Semiconductor Wafer Bonding: Science, Technology and Applications, The Electrochemical Society Proceedings, vol. 93-29 (1993), pp. 71-80.
Suga et al., "Surface activated bonding—an approach to joining at room temperature," Ceramic Transactions: Structural Ceramics Joining II, The American Ceramic Society, 1993, pp. 323-331.
Suga et al., "Surface activated bonding for new flip chip and bumpless interconnect systems," Electronic Components and Technology Conference, 2002, IEEE, pp. 105-111.
Suga, "UHV room temperature joining by the surface activated bonding method," Advances in science and technology, Techna, Faenza, Italie, 1999, pp. C1079-C1089.
Takagi et al., "Effect of surface roughness on room-temperature wafer bonding by Ar beam surface activation," Japanese Journal of Applied Physics, 1998, vol. 37, Part 1, No. 1, pp. 4197.
Takagi et al., "Low temperature direct bonding of silicon and silicon dioxide by the surface activation method," Solid State Sensors and Actuators, 1997, Transducers '97 Chicago, 1997 International Conference, vol. 1, pp. 657-660.
Takagi et al., "Room-temperature bonding of lithium niobate and silicon wafers by argon-beam surface activation," Appl. Phys. Lett., 1999. vol. 74, pp. 2387.
Takagi et al., "Room temperature silicon wafer direct bonding in vacuum by Ar beam irradiation," Micro Electro Mechanical Systems, MEMS '97 Proceedings, 1997, IEEE, pp. 191-196.
Takagi et al., "Room-temperature wafer bonding of Si to LiNbO3, LiTaO3 and Gd3Ga5O12 by Ar-beam surface activation," Journal of Micromechanics and Microengineering, 2001, vol. 11, No. 4, pp. 348.
Takagi et al., "Room-temperature wafer bonding of silicon and lithium niobate by means of argon-beam surface activation," Integrated Ferroelectrics: An International Journal, 2002, vol. 50, Issue 1, pp. 53-59.
Takagi et al., "Surface activated bonding silicon wafers at room temperature," Appl. Phys. Lett. 68, 2222 (1996).
Takagi et al., "Wafer-scale room-temperature bonding between silicon and ceramic wafers by means of argon-beam surface activation," Micro Electro Mechanical Systems, 2001, MEMS 2001, The 14th IEEE International Conference, Jan. 25, 2001, IEEE, pp. 60-63.
Takagi et al., "Wafer-scale spontaneous bonding of silicon wafers by argon-beam surface activation at room temperature," Sensors and Actuators A: Physical, Jun. 15, 2003, vol. 105, Issue 1, pp. 98-102.
Tong et al., "Low temperature wafer direct bonding," Journal of Microlectromechanical systems, Mar. 1994, vol. 3, No. 1, pp. 29-35.
Topol et al., "Enabling technologies for wafer-level bonding of 3D MEMS and integrated circuit structures," 2004 Electronics Components and Technology Conference, 2004 IEEE, pp. 931-938.
Wang et al., "Reliability and microstructure of Au—Al and Au—Cu direct bonding fabricated by the Surface Activated Bonding," Electronic Components and Technology Conference, 2002, IEEE, pp. 915-919.
Wang et al., "Reliability of Au bump-Cu direct interconnections fabricated by means of surface activated bonding method," Microelectronics Reliability, May 2003, vol. 43, Issue 5, pp. 751-756.
Weldon et al., "Physics and chemistry of silicon wafer bonding investigated by infrared absorption spectroscopy," Journal of Vacuum Science & Technology B, Jul./Aug. 1996, vol. 14, No. 4, pp. 3095-3106.
Westphal, W.B. et al., "Dielectric constant and loss data," Air Force Materials Laboratory, Apr. 1972.

(56) References Cited

OTHER PUBLICATIONS

Xu et al., "New Au—Al interconnect technology and its reliability by surface activated bonding," Electronic Packaging Technology Proceedings, Oct. 28-30, 2003, Shanghai, China, pp. 479-483.

Ceramic Microstructures: Control at the Atomic Level, Recent Progress in Surface Activated Bonding, 1998, pp. 385-389.

Bush, Steve, "Electronica: Automotive power modules from on Semi," ElectronicsWeekly.com, indicating an Onsemi AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

Onsemi AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part No. "Onsemi AR0820."

Sony IMX260 image, cross section of Sony dual-pixel sensor product labeled IMX260, showing peripheral probe and wire bond pads in a bonded structure. The part in the image was shipped in Apr. 2016. Applicant makes no representation that the part in the image is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260."

Absen, "Analysis of micro LED large screen display technology—Chip and encapsulation structure", Jan. 26, 2022; downloaded from https://www.absen.com/analysis-of-micro-led-large-screen-display-technology-chip-and-encapsulation-structure/; Oct. 9, 2024; 13 pages.

Avicena Tech Corp., "Avicena Raises $25 Million in Series A to Fund Development of High Capacity microLED-based Optical Interconnects", Press Release: Aug. 2, 2022, https://avicena.tech/press-release-Aug. 2, 2022/, 4 pages.

Ingle et al., "Chipworks shows Samsung ISOCELL cross-section," Apr. 1, 2014; publ. in Image Sensors World Blog; downloaded from https://image-sensors-world.blogspot.com/2014/04/chipworks-shows-samsung-isocell-cross.html; on Oct. 9, 2024; 8 pages.

Jasim et al., "The effect of reflectivity on vesel output performance," Int J Nanoelectronics & Materials. Jan. 1, 2011;4: 65-72.

Liu et al., "A review on micro-LED display integrating metasurface structures." Micromachines. Jun. 30, 2023;14(7): 1354 in 18 pages.

Morgan T.P., "Nvidia Shows What Optically Linked GPU Systems might look like", The Next Platform, Aug. 17, 2022; https://www.nextplatform.com/2022/08/17/nvidia-shows-what-optically-linked-gpu-systems-might-look-like/, 13 pages.

Gordillo O.A.J. et al., "Plug-and-play fiber to waveguide connector", Optics express. Jul. 22, 2019;27(15): 20305-10.

Manda et al., "High-definition Visible—SWIR InGaAs Image Sensor using Cu-Cu Bonding of III-V to Silicon Wafer," In2019 IEEE International Electron Devices Meeting (IEDM) Dec. 7, 2019 (pp. 16-17); DOI: 10.1109/IEDM19573.2019.8993432.

Samsung, "LED (Light Emitting Diode}", published Feb. 6, 2013; downloaded from https://semiconductor.samsung.com/support/tools-resources/dictionary/semiconductor-glossary-leds/ on Oct. 9, 2024, 2 pages.

Zhang et al., "Distributed Bragg reflectors for GaN-based vertical-cavity surface-emitting lasers." Applied Sciences. Apr. 17, 2019;9(8): 1593; 15 pages.

Zhang et al., "Degradation characteristics and mechanism of high speed 850 nm vertical-cavity surface-emitting laser during accelerated aging." Photonics. Oct. 26, 2022; 9(11): 801 in 13 pages.

Zhou et al., GaN-based flip-chip LEDs with highly reflective ITO/DBR p-type and via hole-based n-type contacts for enhanced current spreading and light extraction. Opt Laser Technol. Jul. 1, 2017;92: 95-100.

\* cited by examiner

METHOD OF DIRECT-BONDED OPTOELECTRONIC DEVICES

REFERENCE TO PRIORITY APPLICATIONS

This application is a continuation of U.S. application Ser. No. 18/206,512, filed Jun. 6, 2023, which is a continuation of U.S. application Ser. No. 17/327,169, filed May 21, 2021 (now U.S. Pat. No. 11,715,730), which is a continuation of U.S. application Ser. No. 16/840,245, filed Apr. 3, 2020 (now U.S. Pat. No. 11,329,034), which is a continuation of U.S. application Ser. No. 15/919,570, filed Mar. 13, 2018 (now U.S. Pat. No. 10,629,577), which claims priority to U.S. Provisional Patent Application No. 62/472,363, filed Mar. 16, 2017, the disclosures of which are hereby incorporated by reference herein in their entireties for all purposes.

BACKGROUND

MicroLEDs, also known as micro-LEDs, μLEDs, and "mLEDs" as used herein, are gaining significant attraction as an emerging flat panel display technology. But as of yet, mLED displays have not been mass-produced or commercialized widely. The mLED displays are arrays of microscopic LEDs forming individual pixel elements. Compared to the widespread LCD technology, mLED displays provide greater contrast and faster response times, while using less energy.

Along with organic light-emitting diodes (OLEDs), in which a film of organic compound is stimulated to emit electroluminescence, mLEDs can be used in small low-energy devices such as smart phones and smart watches, where battery power is at a premium.

Both mLEDs and OLEDs require less energy than conventional LCD systems. Unlike OLEDs, however, the mLED technology utilizes conventional III-V inorganic semiconductor materials (GaN, InGaN, etc.) for use as self-emissive LEDs for lighting and display, which can offer higher overall brightness (e.g., 30× over OLEDs) and higher contrast than OLED products, with higher efficiency in lux per watt (lux/W) light output. The mLED technology can also provide a longer working life for the product that is hosting the mLED technology. Versions of this mLED array technology may be ideal for automotive, virtual reality, and augmented reality displays.

SUMMARY

Direct-bonded LED arrays and applications are provided. An example process fabricates a LED structure that includes coplanar electrical contacts for p-type and n-type semiconductors of the LED structure on a flat bonding interface surface of the LED structure. The coplanar electrical contacts of the flat bonding interface surface are direct-bonded to electrical contacts of a driver circuit for the LED structure. In a wafer-level process, micro-LED structures are fabricated on a first wafer, including coplanar electrical contacts for p-type and n-type semiconductors of the LED structures on the flat bonding interface surfaces of the wafer. At least the coplanar electrical contacts of the flat bonding interface are direct-bonded to electrical contacts of CMOS driver circuits on a second wafer. The process provides a transparent and flexible micro-LED array display, with each micro-LED structure having an illumination area approximately the size of a pixel or a smallest controllable element of an image represented on a high-resolution video display.

This summary is not intended to identify key or essential features of the claimed subject matter, nor is it intended to be used as an aid in limiting the scope of the claimed subject matter.

BRIEF DESCRIPTION OF THE DRAWINGS

Certain embodiments of the disclosure will hereafter be described with reference to the accompanying drawings, wherein like reference numerals denote like elements. It should be understood, however, that the accompanying figures illustrate the various implementations described herein and are not meant to limit the scope of various technologies described herein.

DESCRIPTION

This disclosure describes example direct-bonded light emitting diode (LED) arrays and applications. New processes for forming actively driven mLED (microLED) structures and display cells are described, including example processes of array-bonding III-V compound semiconductor mLEDs to silicon driver chips to form actively driven mLED display cells. Some of these processes may be used to mass-produce mLED array displays.

Example Processes and Structures

Figure 1:
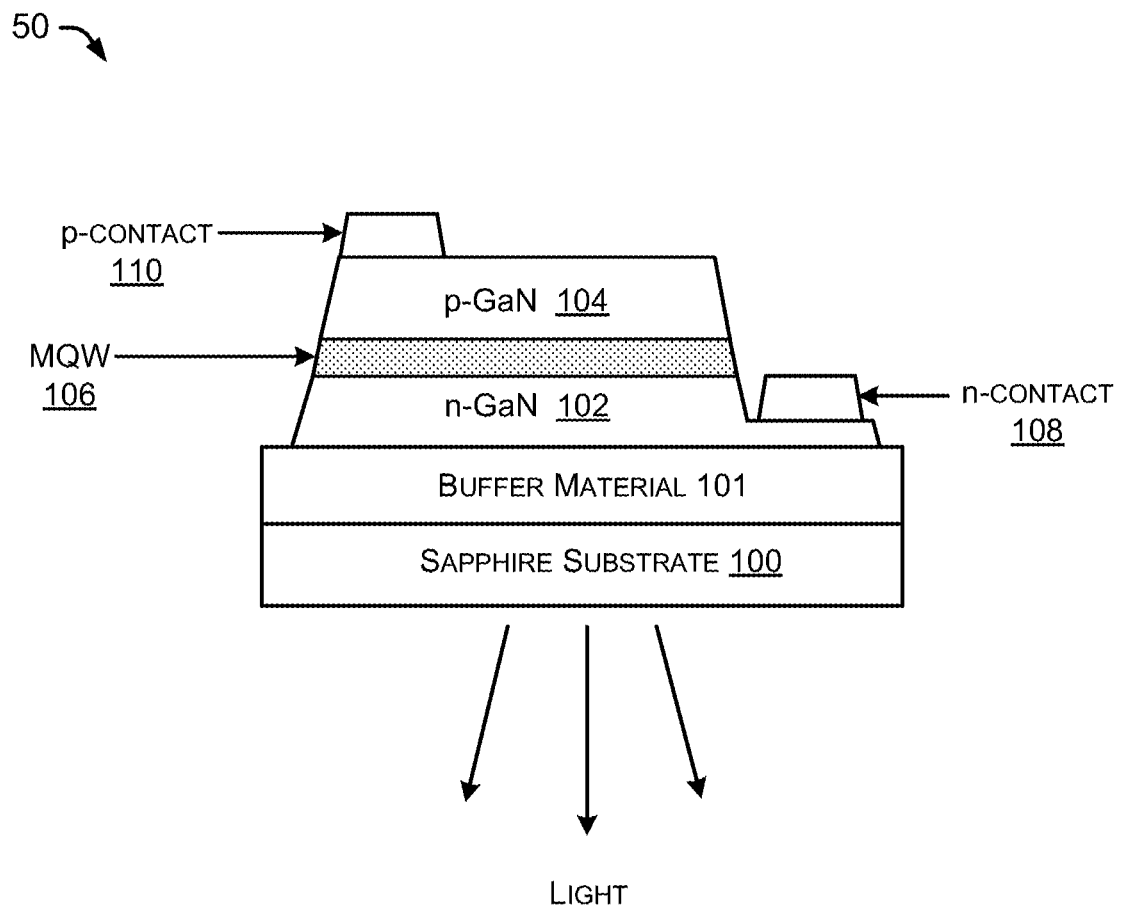
FIG. 1 is a diagram of an example conventional nitride light emitting diode (LED).

FIG. 1 shows an example of a conventional epilayer structure 50 of a light emitting diode (LED) over a sapphire substrate 100, illustrating and comparing some LED components used in example structures and processes described herein. The example conventional LED structure 50 may produce green or blue light, for example. Semiconductor materials are layered on a carrier, such as a sapphire substrate 100. The large mismatches in lattice constants and thermal expansion coefficients between GaN and sapphire 100 would cause high crystalline defect densities in the GaN films, which leads to degradation of device performance; hence a lattice and CTE matched buffer material 101 is deposited on sapphire 100 to grow GaN. Optoelectronic devices like the conventional LED structure 50 utilize semiconductor doping, for example, a small amount of silicon or germanium is added to gallium nitride (GaN) to make the GaN a conductor for electrons (n-type) n-GaN 102, and a small amount of magnesium is added to the gallium nitride (GaN) to make the GaN into a conductor for holes (electron holes) (p-type) p-GaN 104. Between the layer of n-GaN 102 and the layer of p-GaN 104 is sandwiched an ultrathin layer of a light-producing quantum well or multiple quantum well (MQW) material, that has a smaller band gap (and slightly less conductivity) than either the n-GaN 102 and the p-GaN 104, such as indium gallium nitride InGaN, a semiconductor material made of a mix of gallium nitride (GaN) and indium nitride (InN). InGaN is a ternary group III/group V direct band gap semiconductor. The example InGaN/GaN or InGaN MQW layer 106 provides quantum confinement, or discrete energy subbands, in which the carriers can have only discrete energy values, providing better performance in optical devices. Conventional LED structures 50 may have many variations in the number or layers used, and the materials used for each layer. In FIG. 1, the layers, and especially the MQW layer 106, are not shown to relative scale.

The example conventional LED structure 50 is characterized by an n contact 108 and a p contact 110 at different vertical levels on different surfaces of the conventional LED structure 50. The difference in vertical heights between p contact 110 and n contact 108 is conventionally compensated for by wire bond or solder connections. Or, an example conventional structure 50 may have an n contact 108 that is not exposed (not shown).

Figure 2:
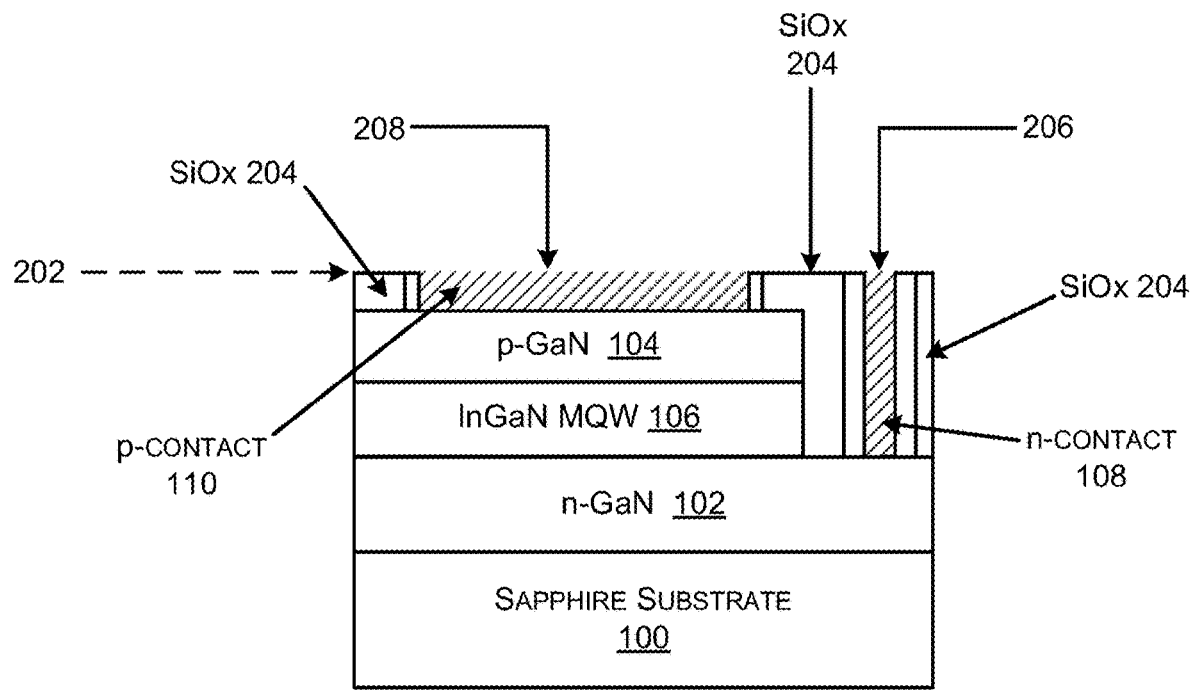
FIG. 2 is a diagram of an example LED structure suitable for direct-bonding of electrical contacts enabling wafer level, chip array-level, and individual chip-level construction of direct-bonded micro-LED structures.
Figure 3:
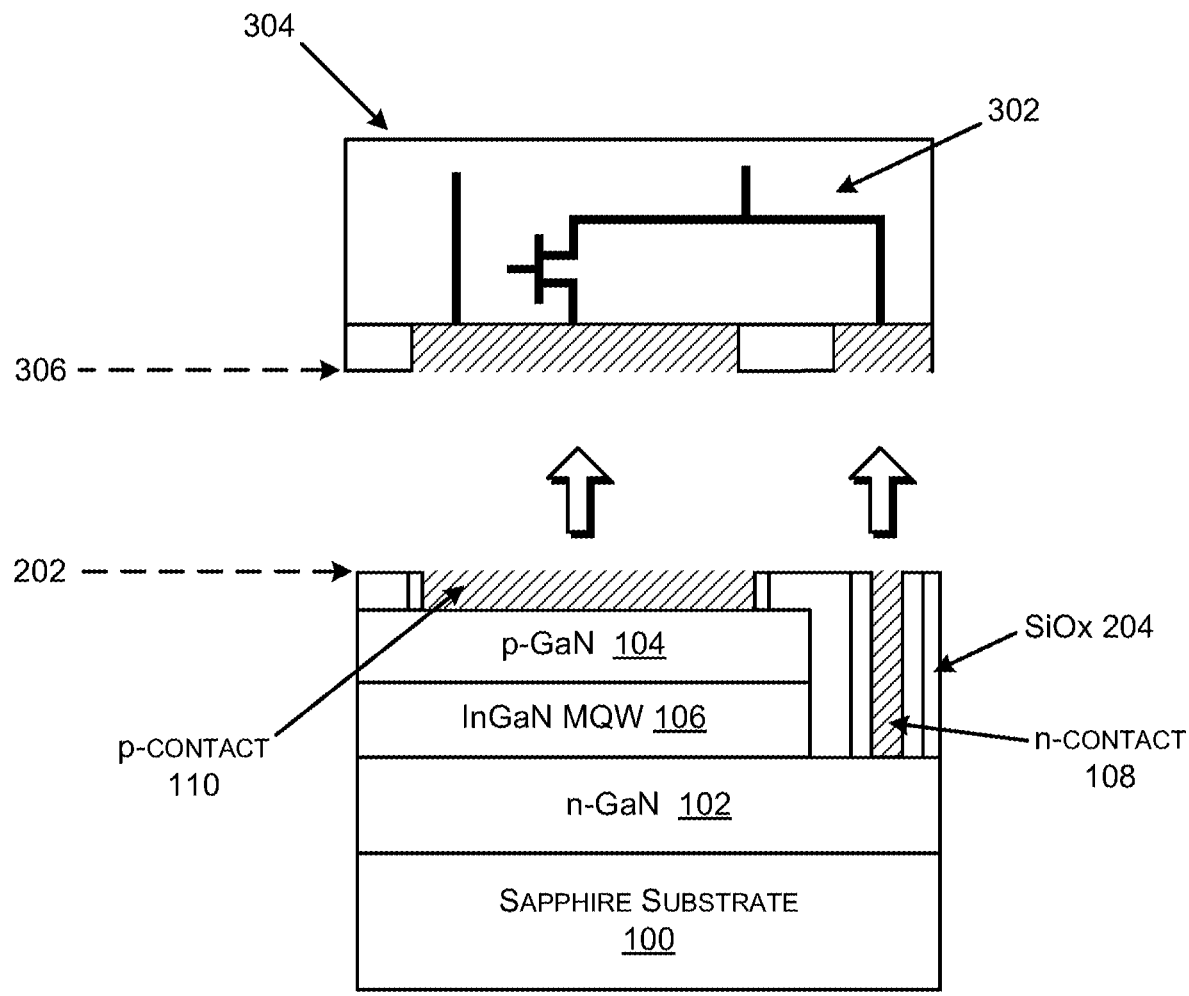
FIG. 3 is a diagram of the example LED structure of FIG. 2, in a direct-bonding operation with driver circuitry.

FIGS. 2-3 show an example LED structure 200 and process overview, for direct-bonding LED components containing III-V semiconductor elements to driver circuitry, for making mLED array displays. The example LED structure 200 provides an ultra-flat bonding interface 202, made flat by chemical-mechanical polishing (CMP) for example, with both n contact 108 and p contact 110 surrounded by an insulator 204, such as a silicon oxide, and exposed on the ultra-flat bonding interface 202 with respective coplanar conductive footprints 206 & 208 on the ultra-flat bonding interface 202.

The n contact 108 and p contact 110 may be made of a metal, or combination of alloyed metals, or laminated metals that enhance direct bonding. Besides metal composition, the ultra-flat bonding interface 202 itself also facilitates direct bonding between the n and p contacts 108 & 110 and respective conductive surfaces being bonded to. The ultra-flat bonding interface 202 fabricated by damascene methods, for example, is also ultra-clean, and flat within a few tens of nanometers, such as less than ¼ the wavelength of an illumination source of monochromatic green light at the 546.1 nm or helium-neon red laser light at 632.8 nm. In some embodiments the roughness of the flat polished surface 202 is less than 5% of the wavelength of an illumination source and preferably less than 10 nm.

FIG. 3 shows an example direct-bonding process 300 between the example LED structure 200 of FIG. 2, and a driver circuit 302 on a chip 304, to form LED circuitry, such as thin-film transistor (TFT) drivers. The example direct-bonding process 300 can be performed at the level of individual chips, or at a chip array level, or at wafer level. For subsequent lift-off and thinning, wafer level direct-bonding may be the best approach.

In an implementation, the mLED ultra-flat bonding interface 202 can be bonded to the respective ultra-flat bonding interface 306 of a silicon-based driver integrated circuit (IC) 304, for example. The ultra-flat bonding interface 306 may have a contacting surface that is topped with a flat silicon oxide layer and copper (Cu) pads to facilitate direct-bonding, for example direct-bonding via a ZiBond® brand process or a DBI® brand process, to form LED circuitry (Xperi Corporation, San Jose, CA). In an implementation, the sapphire substrate 100 may then be laser-lifted off. If desirable, both top and bottom sides can be thinned further to make the entire stack flexible.

Figure 4:
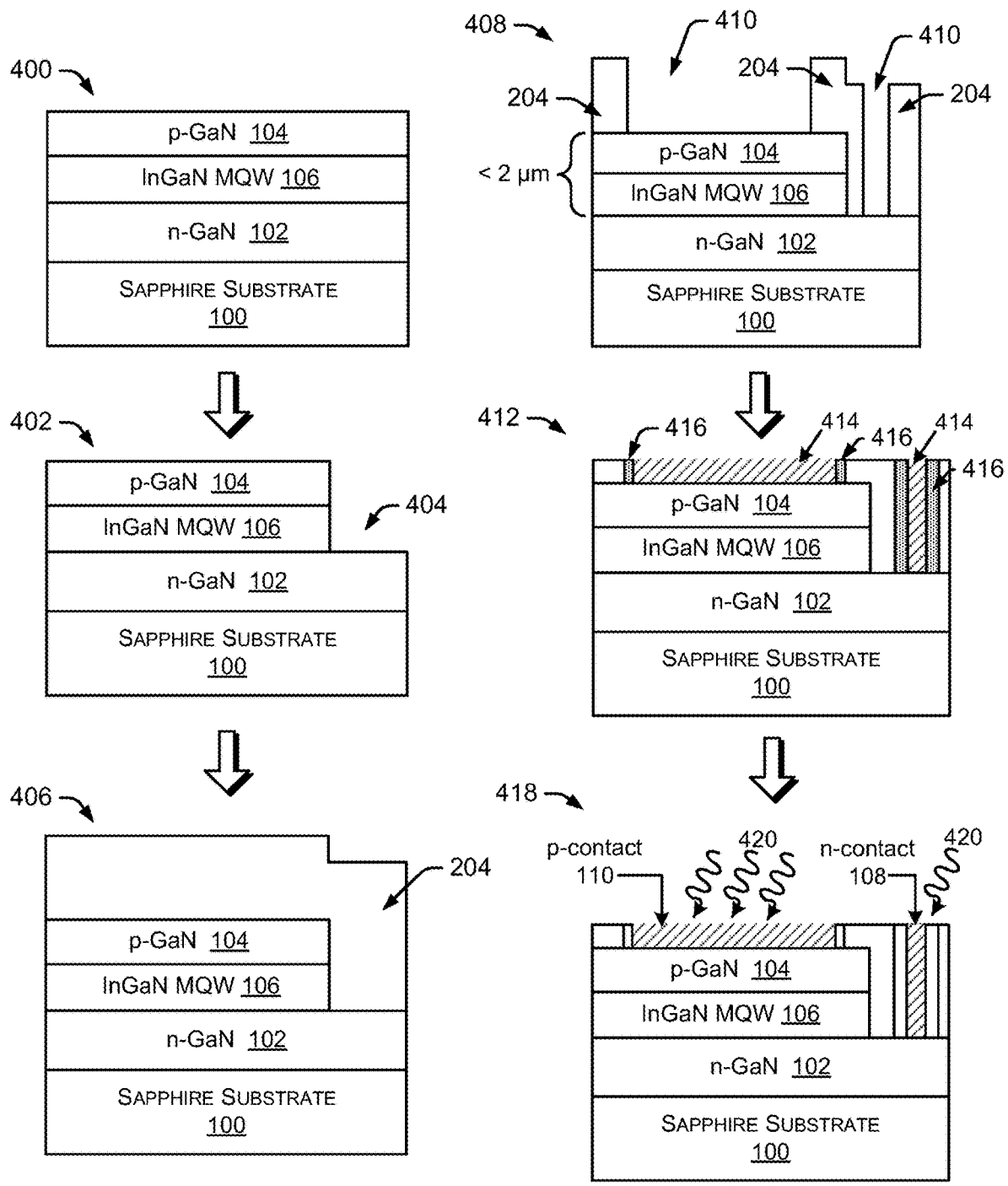
FIG. 4 is a diagram of an example process of fabricating the LED structure of FIG. 2.

FIG. 4 shows stages of example structure fabrication, illustrating an example process flow for making an LED structure 200 suitable for direct-bonding with a silicon driver ICs 304, for example.

In a first stage 400 of the example process flow, an example wafer, such as a sapphire substrate 100, is built up with beginning epitaxial layers of n-GaN 102, InGaN MQW 106, and p-GaN 104.

In a second stage 402 of the example process flow, the top epitaxial layers are patterned and etched to expose the n-GaN layer 102 at specific locations 404. Although the single exposed location 404 is shown at the edge at the die, there may be more than one location. For example, one or more through-vias may expose the n-GaN layer 102. The patterning resist can be left on.

In a third stage 406 of the example process flow, an insulator or dielectric, such as a silicon oxide layer 204 is deposited to cover both the exposed p-GaN 104 and the exposed n-GaN 102, at least at the location of the contacting pads.

In a fourth stage 408 of the example process flow, the silicon oxide layer 204 is patterned and etched over the p-GaN 104 and n-GaN 102 layers to make cavities 410 through the silicon oxide 204 for conductive metals to become the electrodes of the LED structure 200. In an implementation, the total thickness of the p-GaN 104 layer and the MQW 106 layer is approximately 2 µm, making the structure at this stage suitable for one-step etching and metallization (MQW layer 106 not shown to scale). One or more of such cavities 410 can be formed to form one or more electrodes contacting the n-GaN 102 layer and the p-GaN 104 layer.

In an alternative implementation, the example process deposits a flat silicon oxide layer 204 as in the third stage 406 above, then bonds this oxide surface directly with the driving chip(s) 304 using a ZiBond® brand direct-bonding process, or other direct bonding technique. Then, through-silicon-vias (TSVs) are drilled to create the electrical connectivity from the n contact 108 and the p contact 110 to the driver chip 304.

In a fifth stage 412 of the example process flow, the cavities 410 can be metalized with a conductive material 414. In an implementation, barrier and seed layer coatings 416 may be applied and formed, then cavities filled with the conductor 414, followed by annealing, and chemical-mechanical planarization (CMP). In an implementation, a low melting temperature metal, such as indium, may be coated in the cavities.

In a sixth stage 418 of the example process, a top surface of the example LED structure 200 is plasma-activated 420 for the direct-bonding operation. Plasma-activation 420 may be optional for some types of direct-bonding techniques, while in others, the plasma-activation step 420 enhances the bond strength between two metal surfaces, for example, during contact bonding. Plasma-activation 420 may also be applied to the opposing surfaces to be bonded on the driver chip(s) 304.

In various implementations, the example process flow depicted in FIG. 4 may include picking and transferring many small LED chips with high throughput, and direct-bonding at very fine pitch, for example at a pitch of less than 1 mm (even smaller pitch for making micro-projectors), and at a 0.05 mm spacing, and in various implementations all the way down to a 12 um pitch with 6 um bump. The pixel array optics achieve high parallelity of the LED dies 200 to the Si dies 304. Post-processing, such as thinning and laser lift-offs, can be accomplished because the direct-bonding applied results in the flat topography and strong bonding interfaces achieved.

FIGS. 5-9 show an example process for creating a thin, transparent, and flexible mLED array display 500, in which a wafer 502 with the LED structures 200 made by the process of FIG. 4 are now bonded to (for example) a CMOS driver chip wafer 504 to make the transparent and flexible array display 500.

Figure 5:
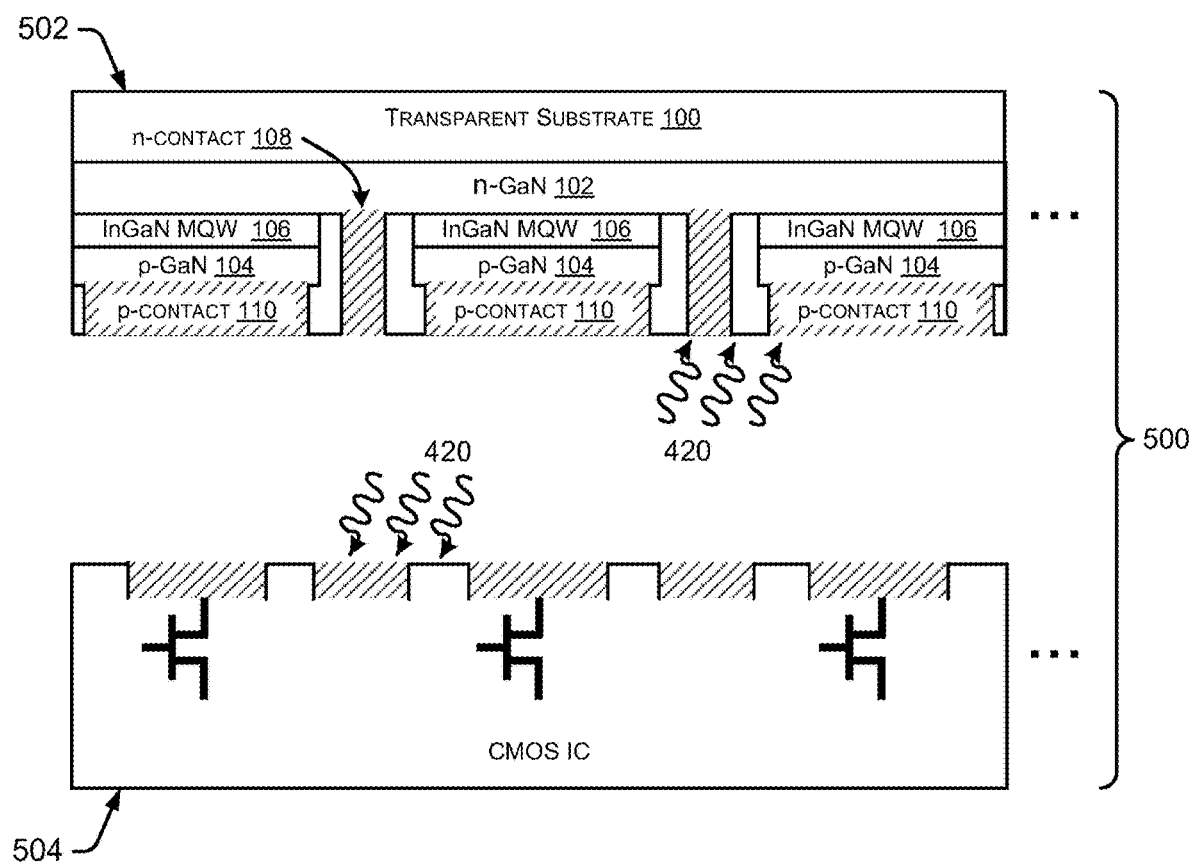
FIG. 5 is a diagram of a first stage of fabricating an example LED array display.

In FIG. 5, in an implementation, after the flat and activated surface on the LED device wafer 502 is formed, the CMOS wafer 504 is planarized with CMP or other means of obtaining an ultra-flat surface, and plasma-activated 420.

Figure 6:
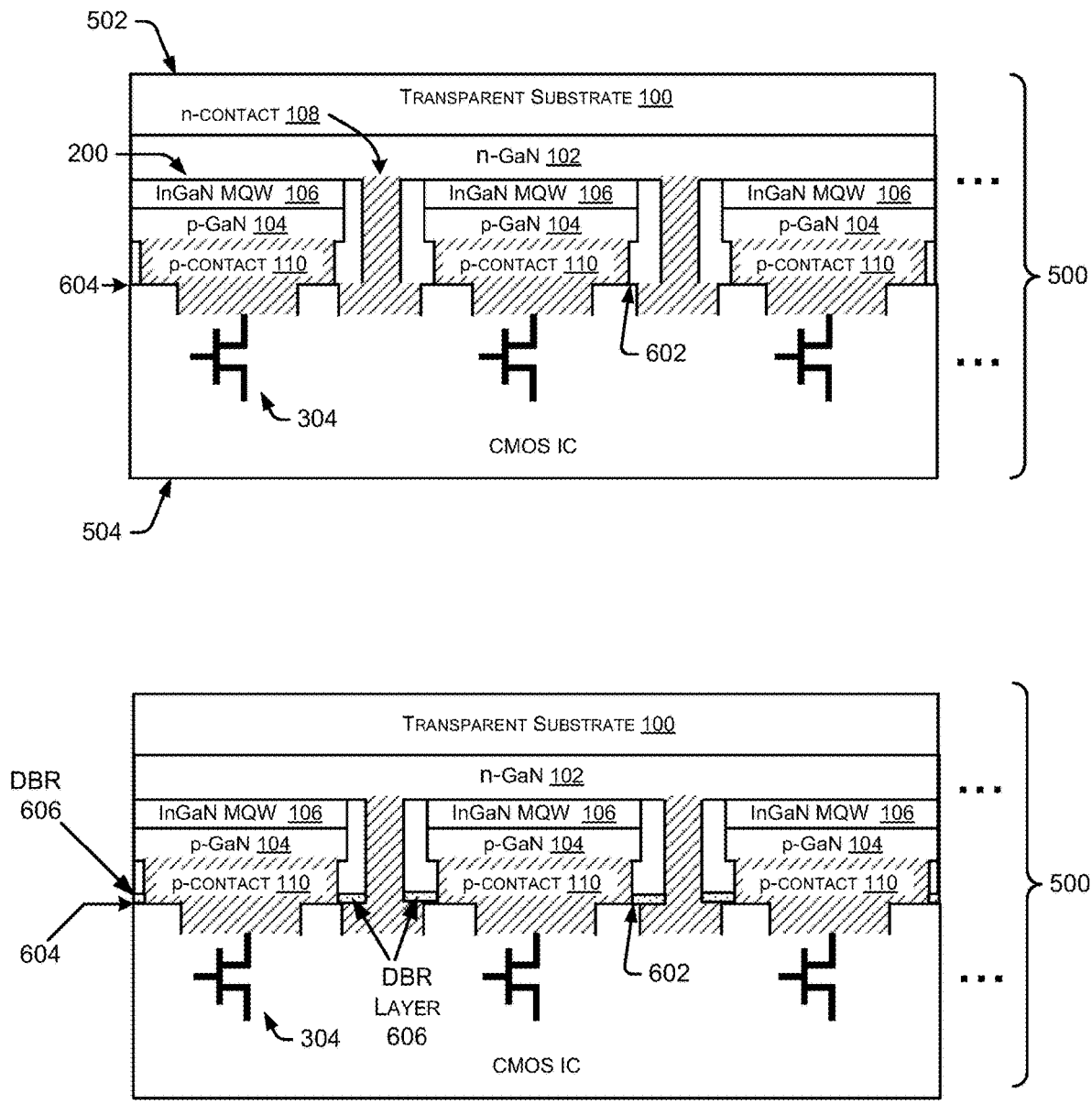
FIG. 6 is a diagram of a second stage of fabricating the example LED array display.

In FIG. 6, the two wafers 502 & 504 are bonded. For example, the first wafer 502 with the LED structures 200 and with coplanar bonding surfaces of the n contacts 108 and p contacts 110, and the second wafer 504 with CMOS driver chips 304, are brought together for direct-bonding between metallic conductors and in an implementation, between nonmetallic dielectric surfaces 602 also. Exposed silicon oxide of the first wafer 502 in contact with exposed silicon oxide of the second wafer 504 bonds first through oxide bonding, as with a ZiBond® brand direct-bonding process. The metal contact pads of the respective wafers 502 & 504 form a metal-to-metal bond during higher-than-room-temperature annealing, as with a DBI® brand direct-bonding process. The bonding interface 604 may be annealed at approximately 100-200° C. to form a strong direct bond interface, such as the ZiBond® or DBI® brand direct-bond interface.

An optical reflective coating, such as distributed Bragg reflector (DBR) 606 (not shown to relative scale), can be deposited to increase light output of the package by choosing different types and thickness of the dielectric layers on top of wafer 502 at the interface (606) between the first wafer 502 and the second wafer 504. Alternatively, the DBR 606 could also be formed on top of the second wafer 504 prior to bonding. In this orientation of a DBR 606, light can escape from the sapphire side of the device. If DBRs 606 are formed on the first wafer 502, then the thin dielectrics need to be deposited at the end of the second stage 402 or the third stage 406 of the process shown in FIG. 4. The DBR 606 is a structure formed from multiple layers of alternating materials with varying refractive index, or by periodic variation of some characteristic, for example, thickness of the dielectrics, resulting in periodic variation in the effective refractive index. These thin layers of dielectric coatings may be the combination of silicon oxide, magnesium fluoride, tantalum pentoxide, zinc sulfide, and titanium dioxide, for example. A silicon oxide SiOx layer on a top surface of the compound wafer 502 can also serve as the last of the coatings which is then bonded directly with direct bonding techniques, such as a ZiBond® or a DBI® process, to wafer 504.

In another embodiment, DBR may be formed at between sapphire and n-GaN. In this orientation, the light will be reflected towards CMOS wafer 504. However, less amount of light will escape as CMOS chip would be obstructing the escape route.

Figure 7:
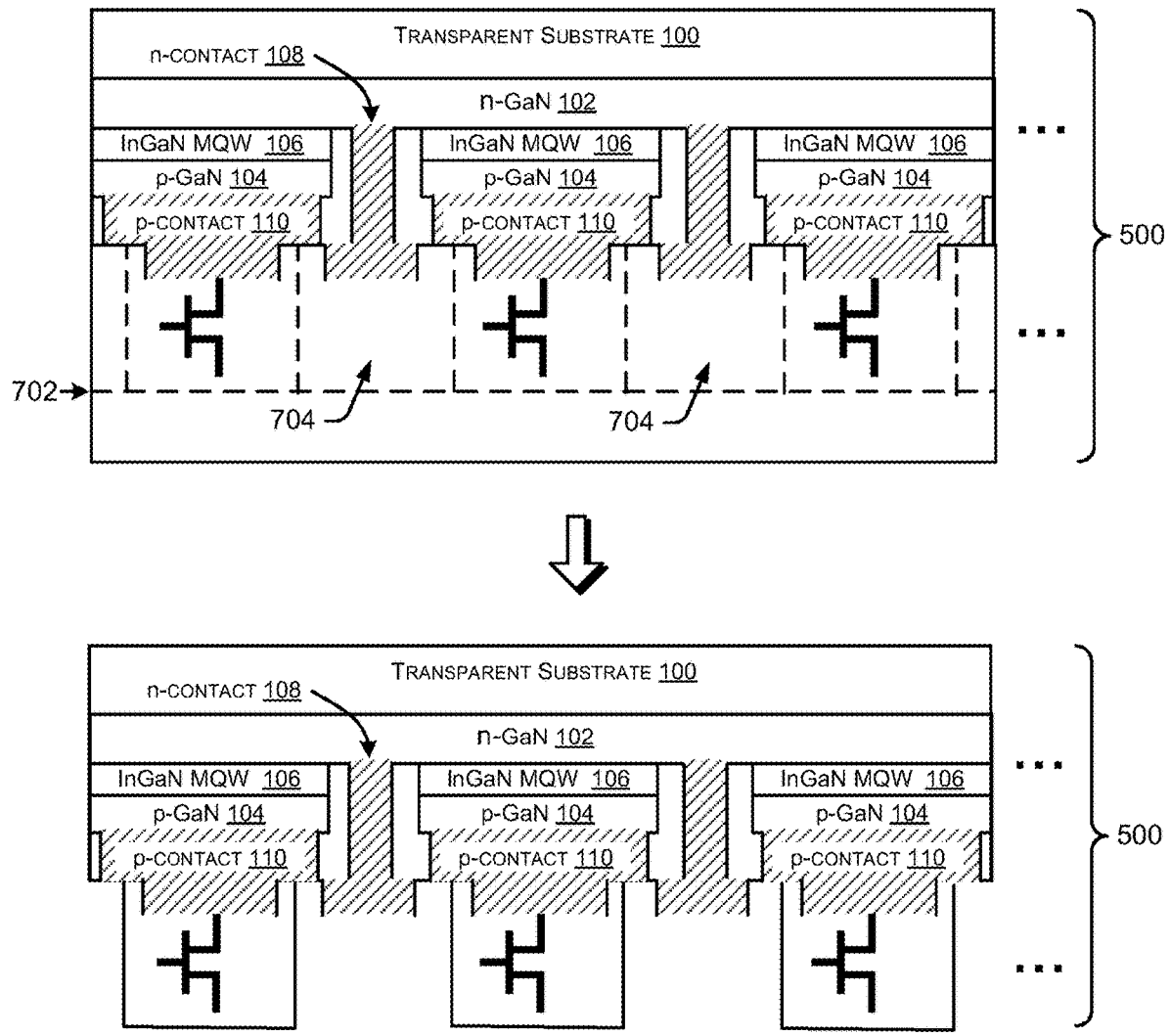
FIG. 7 is a diagram of a third stage of fabricating the example LED array display.

In FIG. 7, the thin-film transistor (TFT) backplane can be thinned 702, which can be facilitated by a ZiBond® brand direct-bonding process. Then the non-transistor parts 704 of the thinned backplane can also be etched away. In this embodiment, the location of one or more n-contacts 108 and p-contacts 110 can be designed such that they may be exposed from the backside after etching of the backplane; and hence can be contacted for power delivery from the back side.

Figure 8:
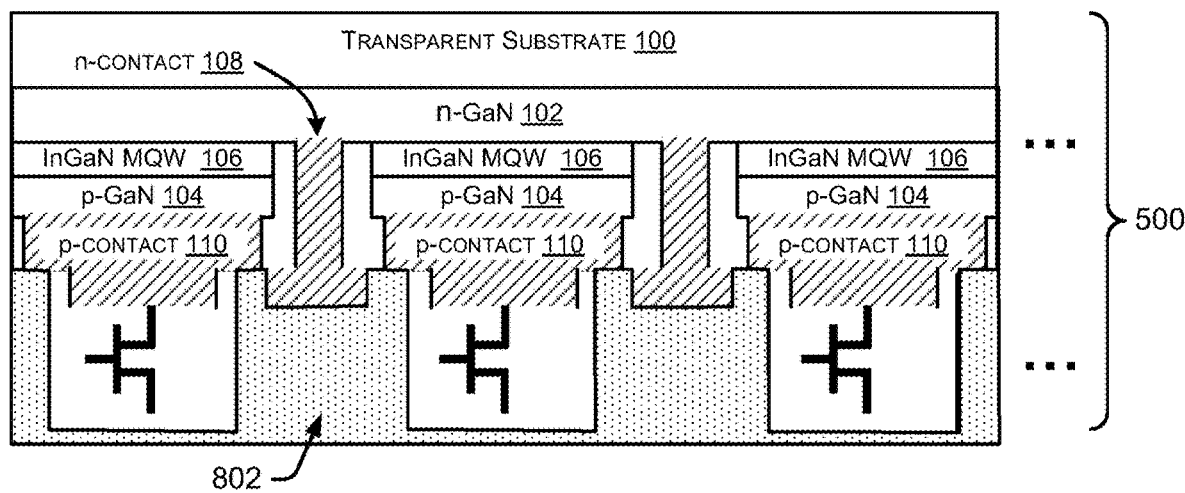
FIG. 8 is a diagram of a fourth stage of fabricating the example LED array display.

In FIG. 8, the thinned and etched transistor surface may be coated with a polyimide (PI) layer 802 or any other dielectric material for protection.

Figure 9:
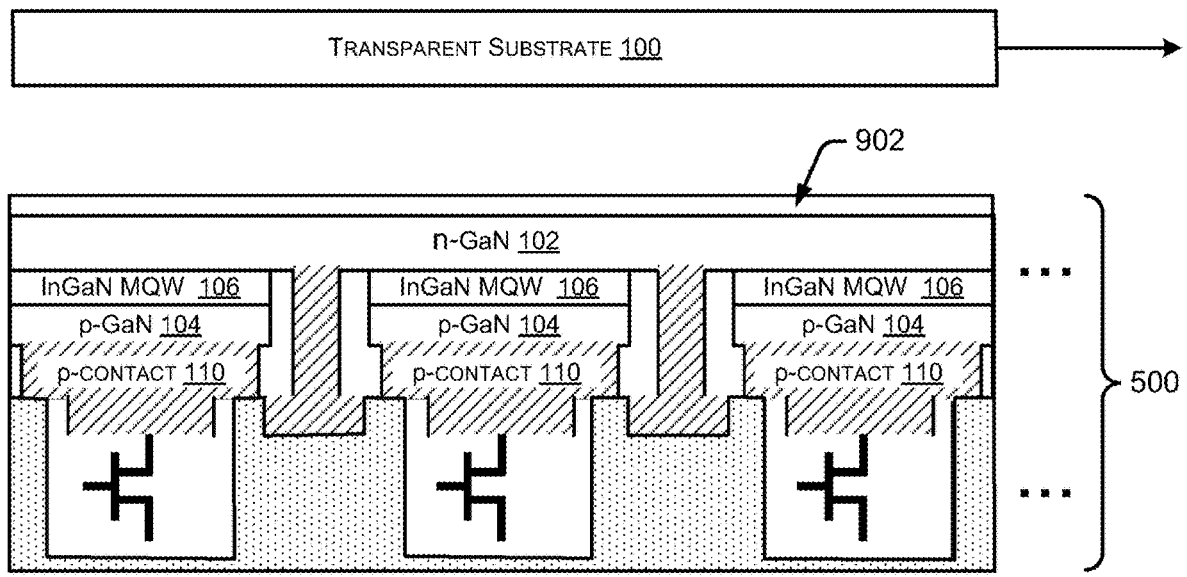
FIG. 9 is a diagram of a fifth stage of fabricating the example LED array display.

In FIG. 9, a laser-lift-off of the sapphire substrate layer 100 may be performed, and this exposed side of the wafer 502 then coated with a flexible organic substrate 902.

In another embodiment, the process to etch and backfill by the transistor backplane by PI may be skipped before a laser-lift-off of the sapphire substrate layer 100. In this embodiment, one or more through-electrodes may be needed in the backplane for power delivery to the electrodes.

Figure 10:
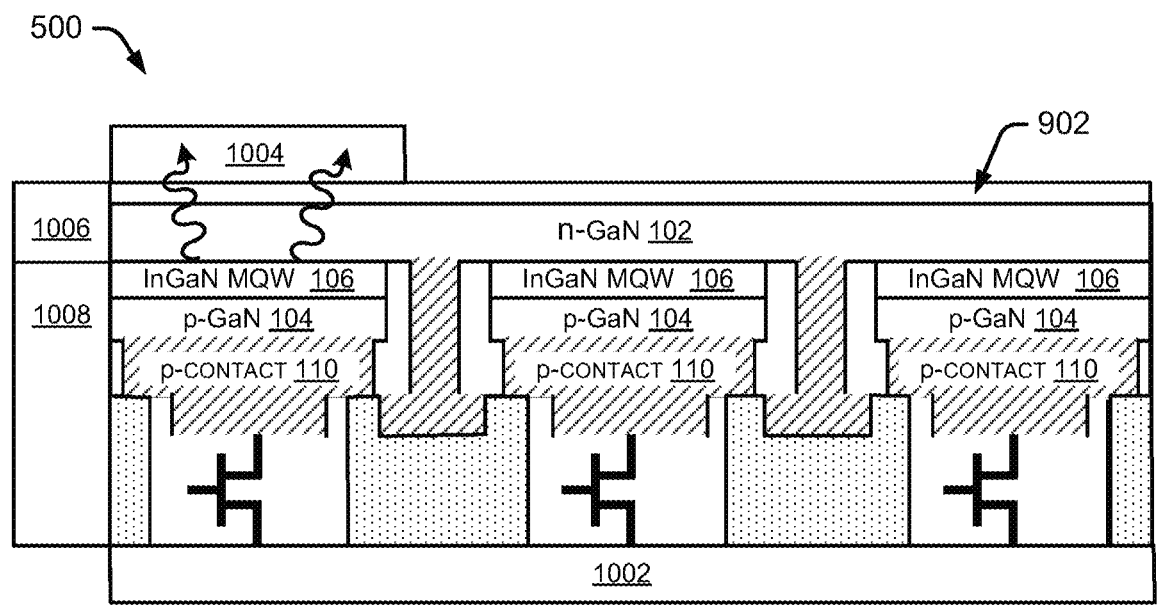
FIG. 10 is a diagram of a completed LED array display and optional components.

FIG. 10 shows operational access available on all sides of example transparent and flexible mLED array displays 500 created with direct-bonding. This versatility is due at least in part to the strong bonds possible with direct bonding, such as DBI® and ZiBond® brand bonding processes, which result in a final structure able to tolerate further processing on multiple sides of the structure 500. For example, besides lifting off the transparent (e.g., sapphire) substrate 100 to make a flexible display 500 bonded to a flexible organic substrate 902, post grinding may be applied and further lift-off performed to make the display thinner, more transparent, and more flexible.

The backside of the mLED array display 500 may be added onto with backside build-up layers 1002 for further 3D integration to attach to memory, printed circuit boards (PCBs), tactile and other sensors, and so forth.

One or more optical waveguides 1004 may be integrated on top of the transparent substrate 902 to transmit optical signals from the LED elements, and also lines for electrical signals may be added. In an implementation, the one or more optical waveguides 1004 are attached to the example LED array display 500 by a direct-bonding technique.

On the sides of the example mLED array display 500, an edge emitting configuration 1006 may be added, and/or optical waveguides on the sides, similar to the one or more optical waveguides 1004 on top. In this embodiment, reflectors may be needed on both sides of the LED devices 200, at layer 902, as well as at the direct-bond (e.g., ZiBond®) interface 604/606.

The structure of the example mLED array display 500 enables multi-junction stacking of compound semiconductors, for solar cells and solar panels, for example.

The sides of the example mLED array display 500 can also accommodate cooling structures 1008.

After removing sapphire layer 100, as in FIG. 8, the surface may be roughened and indium tin oxide (ITO) added to improve the electrical conductivity of the LEDs.

The example steps just described and illustrated above provide direct-bonded light emitting diode (LED) arrays 500, for example arrays of mLEDs, wherein group III-V semiconductor elements are direct-bonded to LED driver circuitry, in wafer-level processes, for example. The arrays 500, made through a direct-bonding process, may be flexible, and possess an optically transparent surface.

In general, the example compound semiconductor-based LED array devices 500 are made with a flat surface composed of coplanar metal regions and dielectric regions. The coplanar metal regions are electrically connected to the active regions of the compound semiconductors of each LED element.

The above compound semiconductor-based LED array structures 500 may include bonds to a CMOS based device connected in a direct-bonding manner. The metal regions and the dielectric regions of the compound semiconductor-based LED array device 500 may be bonded directly to the respective metal regions and dielectric regions of the CMOS based device. Although described with respect to a wafer level process, the example process of FIGS. 5-9 can be used not only for wafer-to-wafer (W2 W) processes, but also die-to-die (D2D), or one or multiple dies-to-wafer (D2 W) processes.

The resulting example LED array structures 500 may also have other characteristics and features:

The resulting LED array structures 500 may have an absence of substrate where the group III-V-based semiconductor light-emitting devices are grown. Further, a surface of the microstructure of the group III-V semiconductor-based light-emitting devices can be advantageously roughened for improved light extraction.

The electrode shape for electrically connecting to the n-GaN 102 and p-GaN 104 active regions via a direct-bonding process, such as a DBI® brand direct-bonding process, can be specially designed, such as frame-traced dot arrays for the electrode or contact 108 of the n-GaN 102 region, and a dot array in a circular or square area for the electrode or contact 110 of the p-GaN 104 region.

Example Processes

Figure 11:
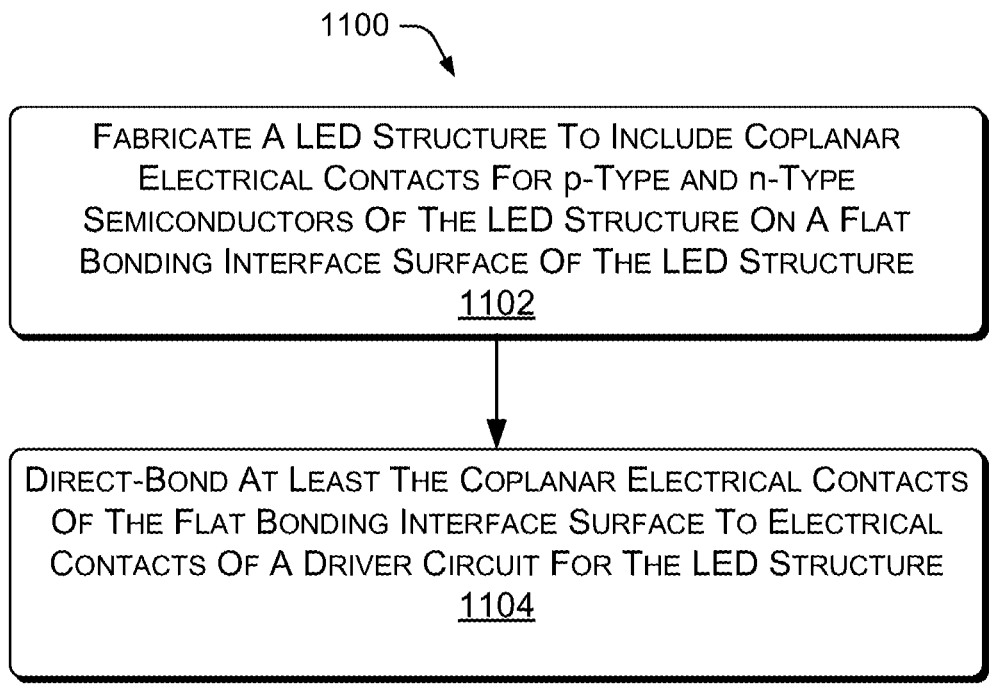
FIG. 11 is a block diagram of an example process of making a direct-bonded LED structure.

FIG. 11 shows an example method 1100 of making a direct-bonded LED structure. In the flow diagram, operations of the example method 1100 are shown in individual blocks.

At block 1102, a LED structure is fabricated with electrical contacts to p-type and n-type semiconductor elements coplanar on a first surface comprising a flat bonding interface of the LED structure.

At block 1104, the first surface is direct-bonded to a second surface comprising a flat bonding interface of a driver circuit for the LED structure.

The direct-bonding operation used in the example method 1100, such as a ZiBond® or a DBI® brand direct-bonding process, may be applied in a wafer level, single chip-level, or a chip array-level process.

In the specification and appended claims: the terms "connect," "connection," "connected," "in connection with," and "connecting," are used to mean "in direct connection with" or "in connection with via one or more elements." The terms "couple," "coupling," "coupled," "coupled together," and "coupled with," are used to mean "directly coupled together" or "coupled together via one or more elements."

While the present disclosure has been disclosed with respect to a limited number of embodiments, those skilled in the art, having the benefit of this disclosure, will appreciate numerous modifications and variations possible given the description. It is intended that the appended claims cover such modifications and variations as fall within the true spirit and scope of the disclosure.

What is claimed is:

1. A method of forming an optoelectronic assembly, comprising:
    directly bonding a lower surface of a first substrate to an upper surface of a second substrate at a bonding interface, the first substrate comprising a plurality of optoelectronic devices;
    after directly bonding, thinning the second substrate from a lower side opposite the upper surface of the second substrate;
    after directly bonding, etching non-device portions of the second substrate from the lower side between device portions of the second substrate; and
    refilling spaces between the device portions with a dielectric material.

2. The method of claim 1, wherein directly bonding comprises
    directly bonding a first dielectric surface of the first substrate to a second dielectric surface of the second substrate at the bonding interface; and
    directly bonding first electrical contacts of the first substrate to second electrical contacts of the second substrate at the bonding interface.

3. The method of claim 2, wherein directly bonding the first dielectric surface with the second dielectric surface comprises oxide bonding.

4. The method of claim 1, wherein directly bonding comprises hybrid bonding.

5. The method of claim 1, further comprising forming electrical connections through the dielectric material to the optoelectronic devices of the first substrate.

6. The method of claim 1, wherein directly bonding comprises annealing the first and second substrate.

7. The method of claim 6, wherein annealing is conducted between about 100° C. and 200° C.

8. The method of claim 1, further comprising plasma activating at least one of the lower surface of the first substrate and the upper surface of the second substrate prior to directly bonding.

9. The method of claim 8, further comprising planarizing each of the lower surface of the first substrate and the upper surface of the second substrate prior to directly bonding.

10. The method of claim 1, wherein the first substrate comprises a compound semiconductor substrate and the second substrate comprises a silicon substrate.

11. The method of claim 10, wherein the optoelectronic devices comprise an array of light emitting diodes, and the device portions comprise transistors forming part of light emitting diode driver circuitry.

12. The method of claim 10, wherein the first substrate comprises a ternary III-V semiconductor substrate.

13. The method of claim 1, further comprising integrating a plurality of optical elements over an upper surface of the first substrate opposite the lower surface of the first substrate.

14. The method of claim 13, wherein optical elements comprise at least one of a beam steering element or a beam shaping element.

15. The method of claim 13, further comprising directly bonding a transparent substrate to the upper surface of the first substrate and positioning the transparent substrate between the optoelectronic devices and the optical elements.

16. The method of claim 13, further comprising integrating one or more second optical elements with the first substrate.

17. The method of claim 16, wherein the one or more second optical elements comprise a waveguide integrated at a side edge of the first substrate.

18. The method of claim 1, wherein etching the non-device portions comprises exposing a portion of the first substrate.

19. The method of claim 1, further comprising processing the lower side of the second substrate after the etching.

20. The method of claim 19, wherein the processing comprises providing electrical connections for the device portions.

21. The method of claim 19, wherein the processing comprises providing one or more build-up layers on the lower side of the second substrate.

\* \* \* \* \*